United States Patent
Kohji et al.

(10) Patent No.: US 9,318,329 B2
(45) Date of Patent: Apr. 19, 2016

(54) METHODS OF FORMING VERTICAL CELL SEMICONDUCTOR DEVICES WITH SINGLE-CRYSTALLINE CHANNEL STRUCTURES

(71) Applicants: Kanamori Kohji, Seoul (KR); Young-Woo Park, Seoul (KR); Jin-Taek Park, Hwaseong-si (KR); Jae-Duk Lee, Seongnam-si (KR)

(72) Inventors: Kanamori Kohji, Seoul (KR); Young-Woo Park, Seoul (KR); Jin-Taek Park, Hwaseong-si (KR); Jae-Duk Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/272,237

(22) Filed: May 7, 2014

(65) Prior Publication Data

US 2015/0004777 A1      Jan. 1, 2015

(30) Foreign Application Priority Data

Jun. 28, 2013   (KR) ........................ 10-2013-0075821

(51) Int. Cl.
  *H01L 21/02*   (2006.01)
  *H01L 21/28*   (2006.01)
  *H01L 27/115*  (2006.01)
  *H01L 29/66*   (2006.01)
  *H01L 29/792*  (2006.01)

(52) U.S. Cl.
  CPC .... *H01L 21/02672* (2013.01); *H01L 21/02532* (2013.01); *H01L 21/28282* (2013.01); *H01L 27/11582* (2013.01); *H01L 29/66833* (2013.01); *H01L 29/7926* (2013.01)

(58) Field of Classification Search
  CPC ................. H01L 21/02667; H01L 21/02592; H01L 27/11551; H01L 27/11556; H01L 27/11558; H01L 27/11563; H01L 27/11582; H01L 21/02672; H01L 21/02532
  See application file for complete search history.

(56) References Cited

U.S. PATENT DOCUMENTS

| | | | |
|---|---|---|---|
| 5,879,977 A * | 3/1999 | Zhang et al. ................. 438/166 |
| 7,879,678 B2 | 2/2011 | Jain | |
| 7,936,004 B2 | 5/2011 | Kito et al. | |
| 8,187,936 B2 | 5/2012 | Alsmeier et al. | |
| 2007/0082433 A1* | 4/2007 | Yang et al. .................... 438/149 |
| 2007/0111487 A1* | 5/2007 | Kim ....................... H01L 27/24 438/478 |
| 2011/0073866 A1 | 3/2011 | Kim et al. | |
| 2011/0227140 A1 | 9/2011 | Ishiduki et al. | |
| 2012/0112260 A1* | 5/2012 | Kim et al. ..................... 257/315 |
| 2012/0153291 A1* | 6/2012 | Kim et al. ....................... 257/66 |

OTHER PUBLICATIONS

Man Wong; *Metal-Induced Laterally Crystallized Polycrystalline Silicon: Technology, Material and Devices*; In Display Technologies III, Proceedings of SPIE vol. 4079 (2000) pp. 28-42.

* cited by examiner

*Primary Examiner* — Marc Armand
*Assistant Examiner* — Christina Sylvia
(74) *Attorney, Agent, or Firm* — Myers Bigel & Sibley, P.A.

(57) ABSTRACT

Methods of fabricating a vertical cell semiconductor device including forming a hole passing through a stacked structure of alternating insulating and sacrificial layers on a substrate, forming an amorphous silicon layer conforming to an inner wall of the hole, forming a silicon region on the amorphous silicon layer, and metal induced crystallizing the amorphous silicon layer via the silicon region to form a single-crystalline channel structure in the hole.

16 Claims, 44 Drawing Sheets

METHODS OF FORMING VERTICAL CELL SEMICONDUCTOR DEVICES WITH SINGLE-CRYSTALLINE CHANNEL STRUCTURES

CROSS-REFERENCE TO RELATED APPLICATION

This application claims priority under 35 U.S.C. §119 to Korean Patent Application No. 10-2013-0075821 filed on Jun. 28, 2013, the disclosure of which is hereby incorporated by reference in its entirety.

BACKGROUND

Some embodiments of the inventive subject matter relate to semiconductor devices and methods of fabricating the same and, more particularly, to vertical cell semiconductor devices and methods of fabricating the same.

In order to reduce a size of a semiconductor device and improve performance, various methods of forming a plurality of memory cells vertically on a substrate are have been developed.

SUMMARY

Some embodiments of the inventive subject matter provide a semiconductor device including a vertical cell structure having a single-crystalline channel area.

Some embodiments of the inventive subject matter provide methods of fabricating a semiconductor device including a vertical cell structure having a single-crystalline channel area.

Some embodiments of the inventive subject matter provide semiconductor modules and electronic systems which include a semiconductor device including a vertical cell structure having a single-crystalline channel area.

Some embodiments of the inventive subject matter provide methods of fabricating a semiconductor device. Alternating interlayer insulating layers and sacrificial layers are formed on a substrate. A first capping layer is formed on the interlayer insulating layers and the sacrificial layers. A channel hole is formed passing through the first capping layer, the interlayer insulating layers and the sacrificial layers to expose a first portion of the substrate. A dielectric pattern conforming to a wall of the channel hole is formed. An amorphous channel active pattern conforming to the dielectric pattern and the exposed first portion of the substrate is formed. A channel core pattern is formed in a space defined by the amorphous channel active pattern. An amorphous silicon layer is formed on the first capping layer and the amorphous channel active pattern. A metal catalytic layer is formed on the amorphous silicon layer. Annealing is performed to change the amorphous silicon layer and the amorphous channel active pattern into a single-crystalline silicon layer and a single-crystalline channel active pattern, respectively.

Forming a metal catalytic layer on the amorphous silicon layer may be preceded by forming an insulating barrier layer on the amorphous silicon layer and forming a metal catalytic layer on the amorphous silicon layer may include forming the metal catalytic layer on the insulating barrier layer. Forming the insulating barrier layer on the amorphous silicon layer may be preceded by forming a mask pattern on the amorphous silicon layer and the amorphous channel active pattern and forming the insulating barrier layer on the amorphous silicon layer may include forming the insulating barrier layer on the mask pattern. The mask pattern may expose a portion of the amorphous silicon layer.

Forming the insulating barrier layer on the mask pattern may be preceded by etching the amorphous silicon layer to form an amorphous silicon pattern having a side wall aligned with a side wall of mask pattern. The etching may expose a portion of the first capping layer. Forming the insulating barrier layer on the mask pattern may include forming the insulating barrier layer on the side wall of the amorphous silicon pattern and the exposed portion of the first capping layer.

In further embodiments, forming an amorphous silicon layer on the first capping layer and the amorphous channel active pattern may be preceded by forming an amorphous channel pad pattern on the amorphous channel active pattern. Forming an amorphous silicon layer on the first capping layer and the amorphous channel active pattern may include forming the amorphous silicon layer on the amorphous channel pad pattern. Annealing to change the amorphous silicon layer and the amorphous channel active pattern into a single-crystalline silicon layer and a single-crystalline channel active pattern, respectively, may include annealing to change the amorphous silicon layer, the amorphous channel active pattern and the amorphous channel pad pattern into a single-crystalline silicon layer, a single-crystalline channel active pattern, and a single-crystalline channel pad pattern, respectively. Forming the amorphous channel pad pattern may include recessing an upper portion of the channel core pattern in the channel hole to form a channel pad space bounded by the amorphous channel active pattern and a top surface of the recessed channel core pattern, and forming the amorphous channel pad pattern in the channel pad space.

In some embodiments, methods may further include forming a metal silicide layer by siliciding a part of the amorphous silicon layer in contact with the metal catalytic layer.

In further embodiments, methods may further include removing the metal catalytic layer, removing the single-crystalline silicon layer, and forming a second capping layer on the single-crystalline channel pad pattern. A trench may be formed passing through the second capping layer, the interlayer insulating layers, and the sacrificial layers, and exposing a second portion of the substrate. Word line spaces may be formed by removing the sacrificial layers through the trench and word lines may be formed in the word line spaces. A device isolation pattern may be formed in the trench.

In some embodiments, a trench may be formed vertically isolating parts of upper surfaces of the interlayer insulating layers, and parts of upper surfaces of the sacrificial layers. A line isolation pattern may be formed in the trench.

In some embodiments, a metal concentration in a portion of the single-crystalline channel active pattern proximate the substrate is greater than metal concentrations in portions of the single-crystalline channel active pattern further displaced from the substrate. For example, the metal concentration in the portion of the single-crystalline channel active pattern proximate the substrate may be less than or equal to about $10^{19}/cm^2$.

In further embodiments, methods may include forming a crystal growth layer on the exposed substrate in the channel hole using an epitaxial growth process prior to forming the amorphous channel active pattern and the single-crystalline channel active pattern. The amorphous channel active pattern and the single-crystalline channel active pattern may be formed in direct contact with the crystal growth layer.

Further embodiments provide methods of fabricating a semiconductor device including forming a stacked structure of alternating interlayer insulating layers and sacrificial layers on a substrate, forming a channel hole vertically passing through the stacked structure and exposing a portion of the substrate, forming a channel structure including amorphous silicon in the channel hole, forming a metal catalytic layer on the channel structure, annealing to change the amorphous silicon of the channel structure to single-crystalline silicon, removing the metal catalytic layer, and forming a bit line plug and a bit line on the channel structure.

Forming a metal catalytic layer may be preceded by forming a silicon region on the channel structure. Forming the metal catalytic layer may include forming the metal catalytic layer on the amorphous silicon region. Annealing to change the amorphous silicon of the channel structure to single-crystalline silicon may include annealing to change amorphous silicon in the silicon region and the channel structure to single-crystalline silicon using a metal induced crystallization that proceeds from the amorphous silicon region to the channel structure. The methods may further include removing the crystallized silicon region prior to forming the bit line plug and the bit line. The methods may also include removing portions of the sacrificial layers to form word line spaces between the insulating layers and forming word lines in the word line spaces.

Still further embodiments provide methods of fabricating a semiconductor device including forming a hole passing through a stacked structure of alternating insulating and sacrificial layers on a substrate, forming an amorphous silicon layer conforming to an inner wall of the hole, forming a silicon region on the amorphous silicon layer, metal induced crystallizing the amorphous silicon layer via the silicon region to form a single-crystalline channel structure in the hole, removing the silicon region, removing portions of the sacrificial layers to form word line spaces, forming word lines in the word line spaces, and forming a bit line electrically coupled to the channel structure. Metal induced crystallizing the amorphous silicon layer via the silicon region to form a single-crystalline channel structure in the hole may include forming a metal catalytic layer on the silicon region and annealing to metal induced crystallize the amorphous silicon layer via the silicon region.

BRIEF DESCRIPTION OF THE DRAWINGS

The foregoing and other features and advantages of the inventive subject matter will be apparent from the more particular description of preferred embodiments of the inventive subject matter, as illustrated in the accompanying drawings in which like reference numerals denote the same respective parts throughout the different views. The drawings are not necessarily to scale, emphasis instead being placed upon illustrating the principles of the inventive subject matter. In the drawings.

DETAILED DESCRIPTION

Figure 1:
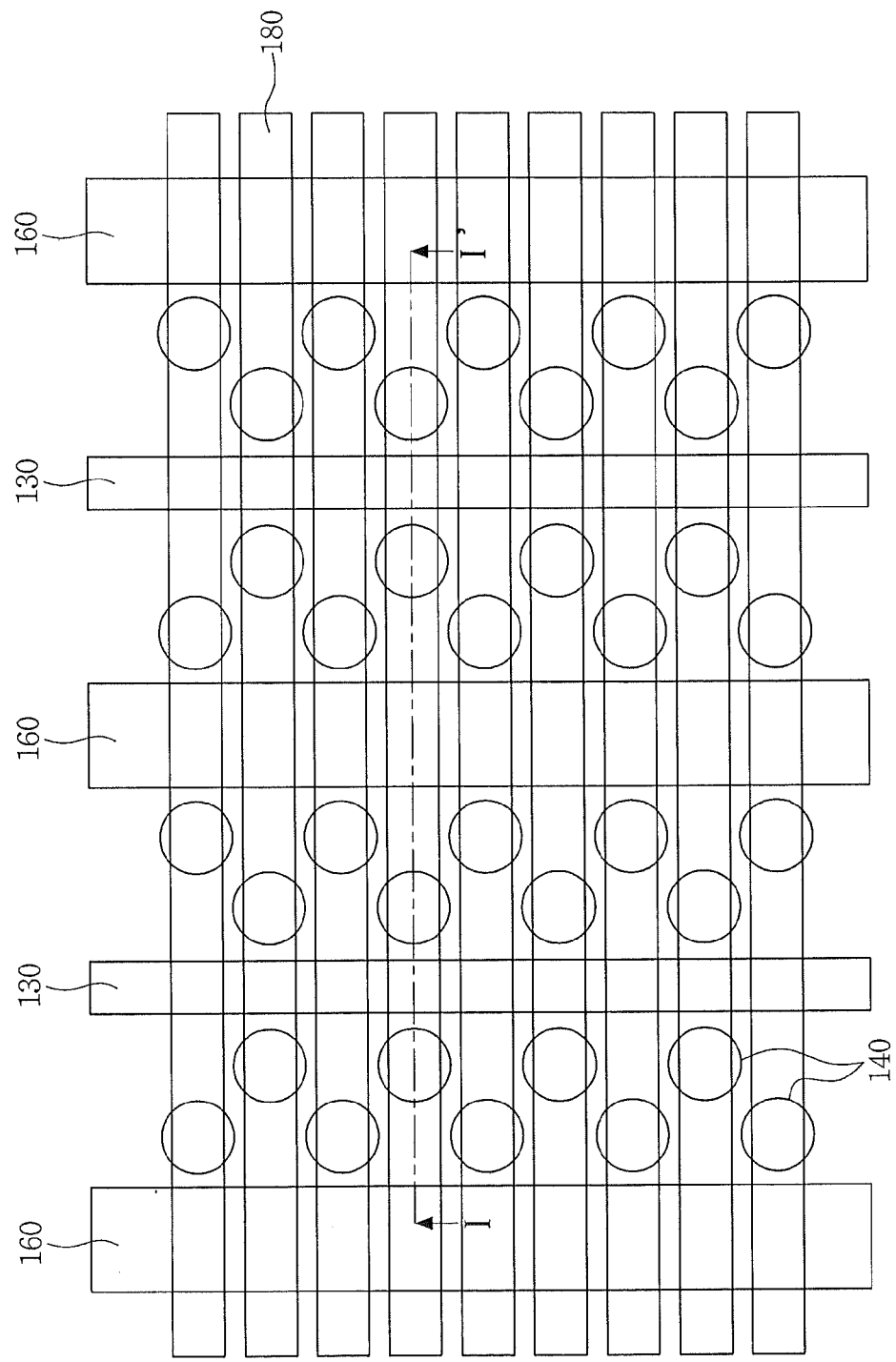
FIG. 1 is a layout showing a semiconductor device in accordance with some embodiments of the inventive subject matter.

Various embodiments will now be described more fully with reference to the accompanying drawings in which some embodiments are shown. These inventive subject matter may, however, be embodied in different forms and should not be construed as limited to the embodiments set forth herein. Rather, these embodiments are provided so that this disclosure is thorough and complete and fully conveys the inventive subject matter to those skilled in the art.

The terminology used herein to describe embodiments of the invention is not intended to limit the scope of the invention. The articles "a," "an," and "the" are singular in that they have a single referent; however, the use of the singular form in the present document should not preclude the presence of more than one referent. In other words, elements of the invention referred to in the singular may number one or more, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In the drawings, the sizes and relative sizes of layers and regions may be exaggerated for clarity. It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. In the following explanation, the same reference numerals denote the same components throughout the specification.

Spatially relative terms, such as "beneath," "below," "lower," "above," "upper," and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation.

It will be understood that, although the terms first, second, A, B, etc. may be used herein in reference to elements of the invention, such elements should not be construed as limited by these terms. For example, a first element could be termed a second element, and a second element could be termed a first element, without departing from the scope of the present invention. Herein, the term "and/or" includes any and all combinations of one or more referents.

Unless otherwise defined, all terms (including technical and scientific terms) used herein are to be interpreted as is customary in the art to which this invention belongs. It will be further understood that terms in common usage should also be interpreted as is customary in the relevant art and not in an idealized or overly formal sense unless expressly so defined herein.

Figure 2:
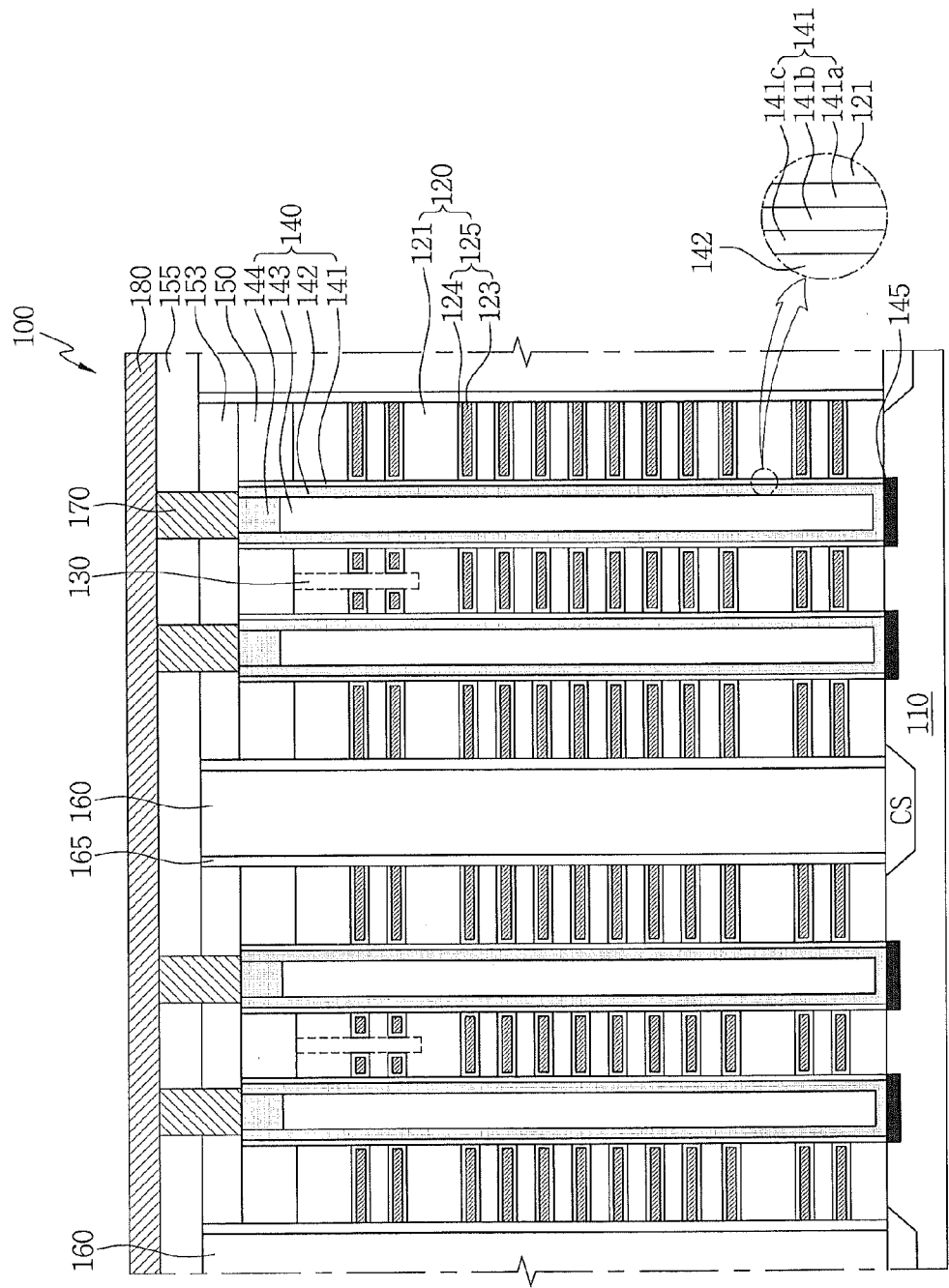
FIG. 2 is a vertical cross sectional view taken along line I-I' in FIG. 1.

FIG. 1 is a layout showing a semiconductor device in accordance with some embodiments of the inventive subject matter, and FIG. 2 is a vertical cross sectional view taken along line I-I' in FIG. 1.

Referring to FIGS. 1 and 2, a semiconductor device 100 in accordance with some embodiments of the inventive subject matter may include stacked structures 120, line isolation patterns 130, channel structures 140, first to third capping layers 150, 153, and 155, device isolation patterns 160, bit line plugs 170, and bit lines 180, which are formed on a substrate 110.

Each of the stacked structures 120 may include a plurality of interlayer insulating layers 121 and a plurality of word lines 125 alternately and repeatedly stacked on the substrate 110. Some of the interlayer insulating layers 121 may be relatively thick. The interlayer insulating layers 121 may include silicon oxide. Each of the word lines 125 may include a word line electrode 123 and a blocking pattern 124. The word line electrode 123 may include one of a metal, a metal compound, or a metal alloy. The blocking pattern 124 may surround the word line electrode 123. The blocking pattern 124 may include an insulating material having a relatively higher work function than the interlayer insulating layers 121. For example, the blocking pattern 124 may include a metal oxide, such as hafnium oxide (HfO), zirconium oxide (ZrO), lanthanum oxide (LaO), or aluminum oxide (AlO).

The line isolation patterns 130 may vertically pass through parts of the interlayer insulating layers 121 and the word lines 125 disposed on an upper part. The line isolation patterns 130 may include silicon oxide. The word lines 125 isolated by the line isolation patterns 130 may be string selection lines SSL.

The channel structures 140 may vertically pass through the interlayer insulating layers 121 and the word lines 125 to be in contact with the substrate 110. Each of the channel structures 140 may include a dielectric pattern 141, a single-crystalline channel active pattern 142, a channel core pattern 143, and a single-crystalline channel pad pattern 144 conformally formed in a channel hole H.

The dielectric patterns 141 may be in direct contact with the interlayer insulating layers 121 and the blocking patterns 124.

Referring further to FIG. 2, the dielectric pattern 141 may include a barrier dielectric pattern 141a, a trap dielectric pattern 141b, and a tunnel dielectric pattern 141c which are conformally formed on an inner wall of the channel hole H. The barrier dielectric pattern 141a may include, for example, silicon oxide. The trap dielectric pattern 141b may include at least one of silicon nitride and a high dielectric material. The high dielectric material may include one of aluminum oxide (AlO), zirconium oxide (ZrO), hafnium oxide (HfO), or lanthanum oxide (LaO). The tunnel dielectric pattern 141c may include, for example, at least one of silicon oxide and N-doped silicon oxide.

The single-crystalline channel active patterns 142 may include single-crystalline silicon. Ending parts EP of the single-crystalline channel active patterns 142 may include a higher concentration of metal than upper and middle parts of the single-crystalline channel active patterns 142. The concentration of the metal in the ending parts EP of the single-crystalline channel active patterns 142 may be about $10^{19}/cm^2$ or less.

The channel core patterns 143 may include an insulating material filling the channel holes H on the single-crystalline channel active patterns 142. For example, the channel core patterns 143 may include silicon oxide.

The single-crystalline channel pad patterns 144 may be formed on the channel core patterns 143. Side surfaces of the single-crystalline channel pad patterns 144 may be surrounded by the single-crystalline channel active patterns 142. The single-crystalline channel pad patterns 144 may include single-crystalline silicon. The single-crystalline channel pad patterns 144 may include the same material as the single-crystalline channel active patterns 142 so as to be materially continuous.

The first capping layer 150 may be formed on the uppermost interlayer insulating layer 121 to cover the line isolation patterns 130. The second capping layer 153 may be formed on the first capping layer 150 to cover the channel structures 140. The third capping layer 153 may be formed on the second capping layer 153 to cover the device isolation patterns 160. The first to third capping layers 150, 153, and 155 may include silicon oxide.

The device isolation patterns 160 may vertically pass through the stacked structure 120, the second capping layer 153, and the first capping layer 150 to be in contact with the substrate 110. The device isolation patterns 160 may be horizontally spaced apart from the channel structures 140 by a predetermined distance. The device isolation patterns 160 may include silicon oxide.

Insulative spacers 165 may be formed on side surfaces of the device isolation pattern 160. The spacers 165 may include silicon nitride or silicon oxide. The spacers 165 may be interposed between the device isolation patterns 160 and the stacked structures 120 to be in contact with the blocking patterns 124.

The bit line plugs 170 may vertically pass through the second and third capping layers 153 and 155 to be formed on single-crystalline channel pad patterns 144 of the channel structures 140. For example, the bit line plugs 170 may be in direct contact with the single-crystalline channel pad patterns 144 to be electrically connected thereto. The bit line plugs 170 may include a metal compound or a metal silicide. Side surfaces of the bit line plugs 170 may be surrounded by the second and third capping layers 153 and 155 formed of an insulating material.

The bit lines 180 may be formed on the third capping layer 153 to be electrically connected to the bit line plugs 170. The bit lines 180 may include a metal or a metal compound. In a plan view, the bit lines 180 may have a parallel line shape.

The semiconductor device 100 in accordance with some embodiments of the inventive subject matter may include the single-crystalline channel active patterns 142 and the single-crystalline channel pad patterns 144. Accordingly, the semiconductor device 100 achieves superior carrier mobility, high speed operation, a lower leakage current, superior data retention, and a longer life. Since the single-crystalline channel patterns 142 and 144 have low electrical resistance, the semiconductor device 100 has excellent performance and operates stably even under a lower voltage and lower current condition.

FIGS. 3 to 27 are vertical cross sectional views taken along line I-I' in FIG. 1 in order to describe operations for fabricating semiconductor devices in accordance with various embodiments of the inventive subject matter.

Figure 3:
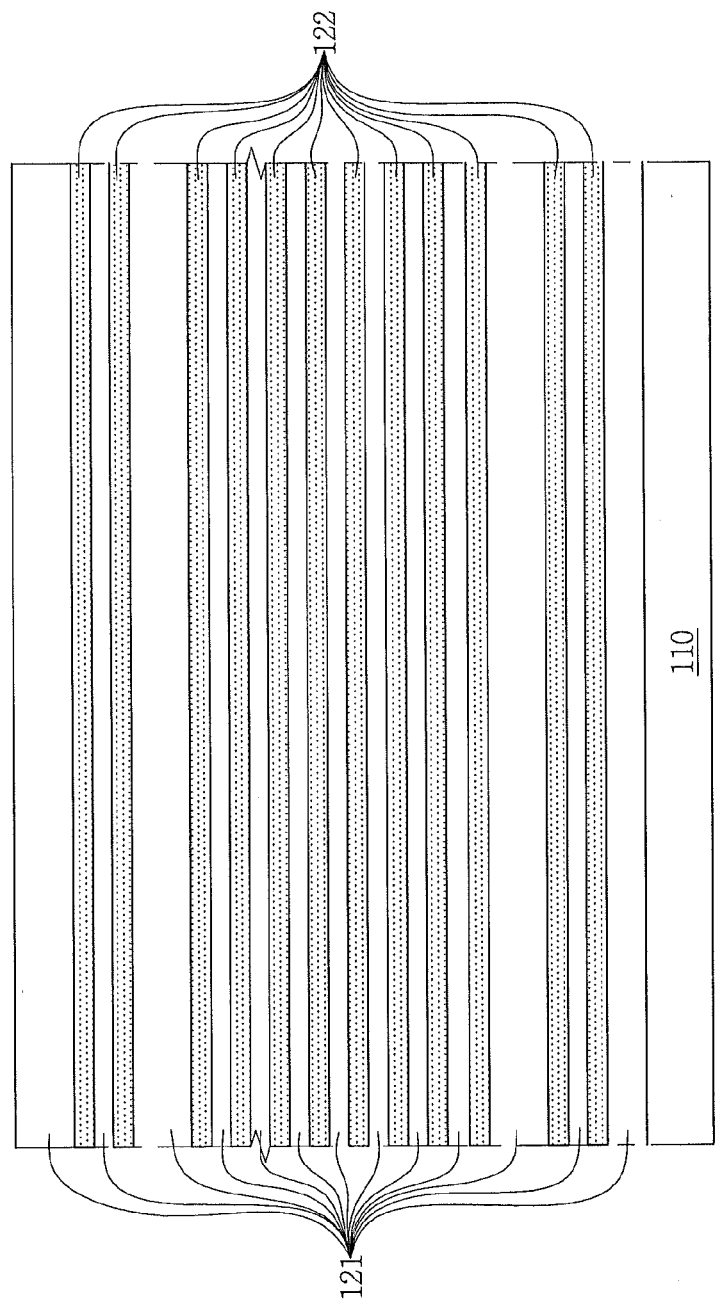
FIGS. 3 to 27 are views illustrating operations for fabricating semiconductor devices in accordance with various embodiments of the inventive subject matter.

Referring to FIG. 3, operations for fabricating semiconductor devices in accordance with some embodiments of the inventive subject matter may include alternately and repeatedly forming a plurality of interlayer insulating layers 121 and a plurality of sacrificial layers 122 on a substrate 110. Forming the interlayer insulating layers 121 may include performing a deposition process to form silicon oxide layers. Forming the sacrificial layers 122 may include performing a deposition process to form silicon nitride layers.

Figure 4:
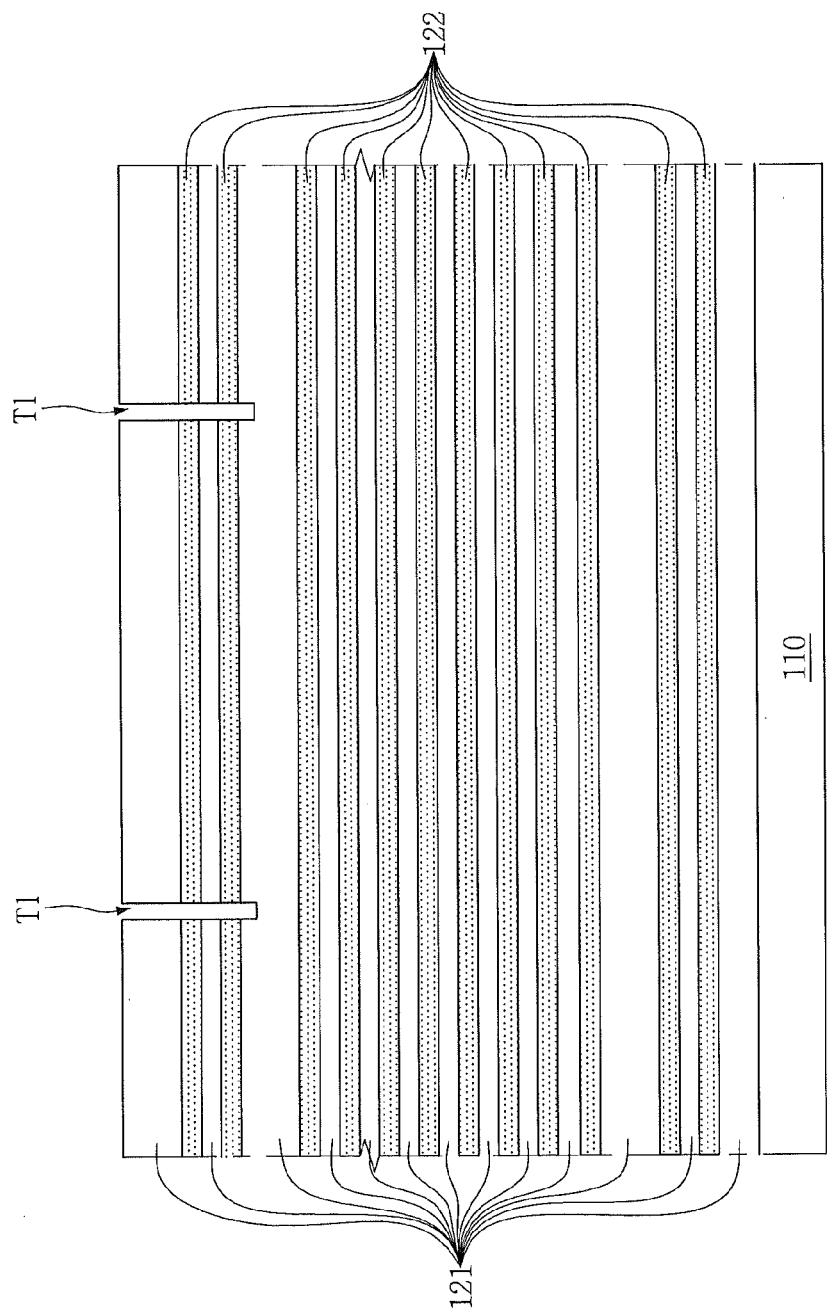

Referring to FIG. 4, the operations may include forming trenches T1. The trenches T1 may cut off a few of the interlayer insulating layers 121 and a few of the sacrificial layers 122 disposed on an upper part. Bottoms of the trenches T1 may be located in one of the interlayer insulating layers 121. The few of the sacrificial layers 122 cut off by the trenches T1 may include sacrificial layers 122 corresponding to a string selection line SSL which is to be formed in a following process.

Figure 5:
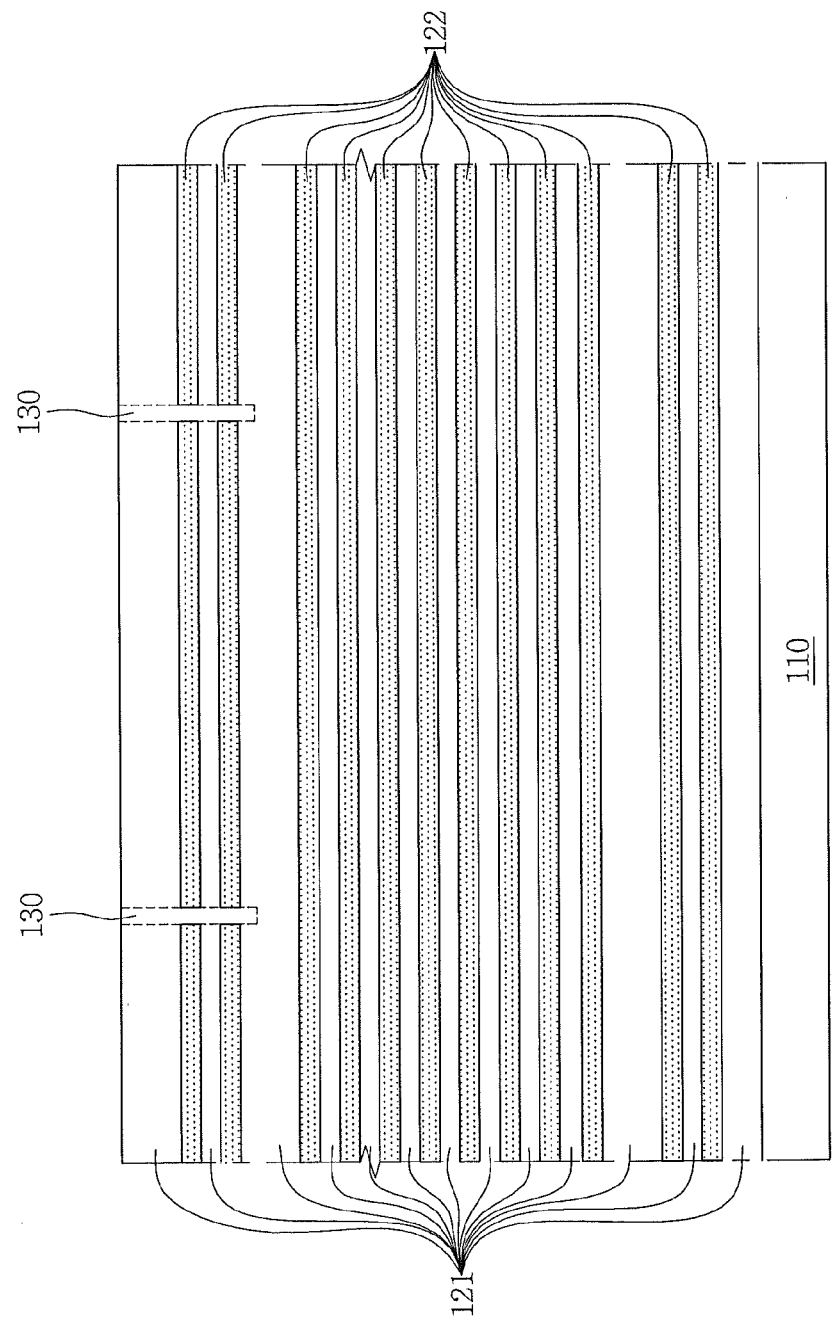

Referring to FIG. 5, operations may include forming line isolation patterns 130 filling the trenches T1, and performing a planarization process such as CMP in such a way that upper surfaces of the line isolation patterns 130 is located at the same level as (coplanar with) the uppermost interlayer insulating layer 121.

The formation of the line isolation patterns 130 may include forming an insulating material to fill the inside of the trenches T1. For example, the line isolation patterns 130 may include silicon oxide. Here, the line isolation patterns 130 may be formed to be materially continuous with the interlayer insulating layers 121. In FIG. 5, the line isolation pattern 130 is marked with a dotted line in order to distinguish the line isolation pattern 130 from the interlayer insulating layers 121.

Figure 6:
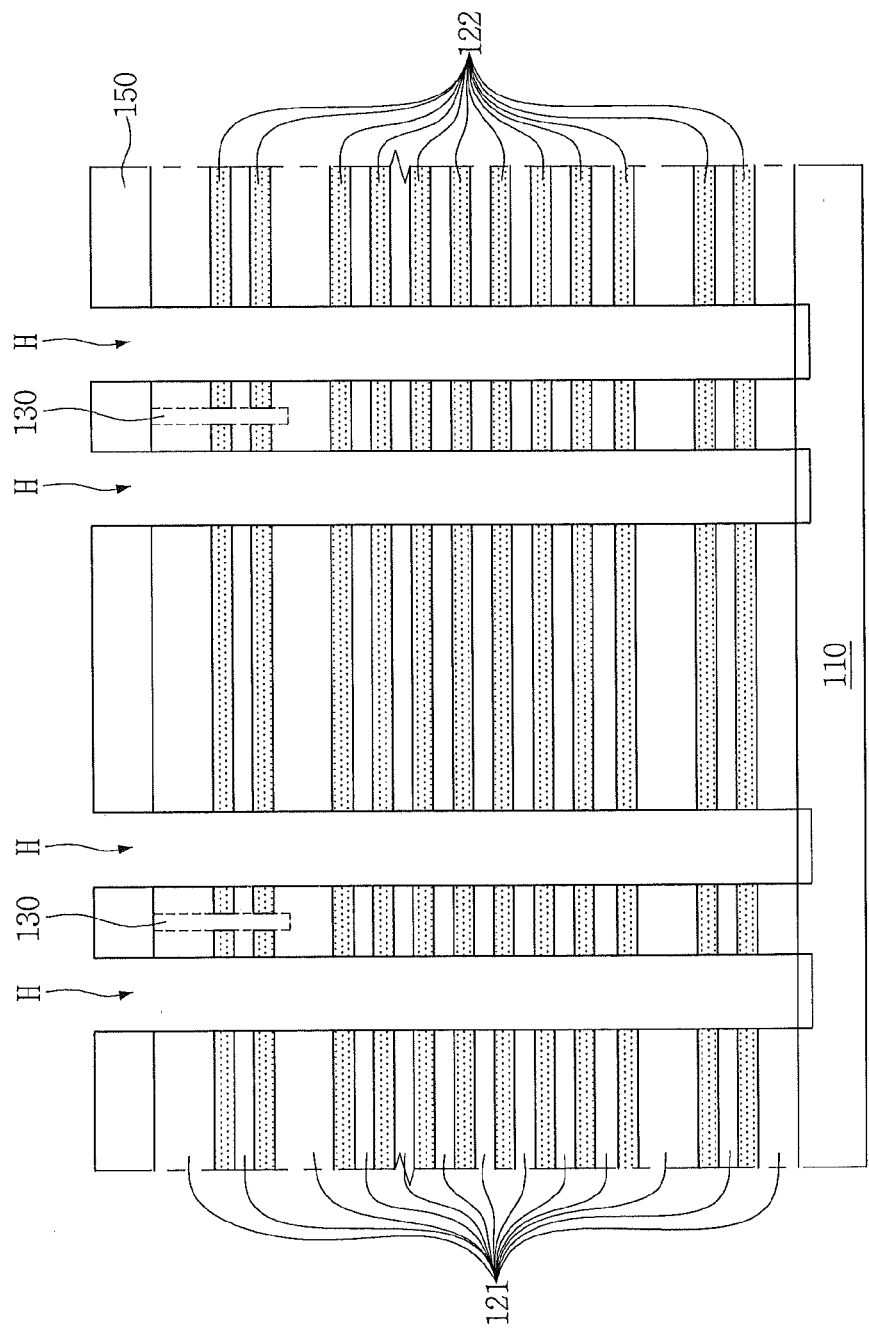

Referring to FIG. 6, operations may include forming a first capping layer 150 on the uppermost interlayer insulating layer 121 to cover the line isolation patterns 130, and forming a plurality of channel holes H passing vertically through the first capping layer 150, the interlayer insulating layers 121, and the sacrificial layers 122 and exposing the substrate 110. The first capping layer 150 may include an insulating material, for example, silicon oxide. A surface of the substrate 110 exposed in the plurality of channel holes H may be recessed.

Figure 7:
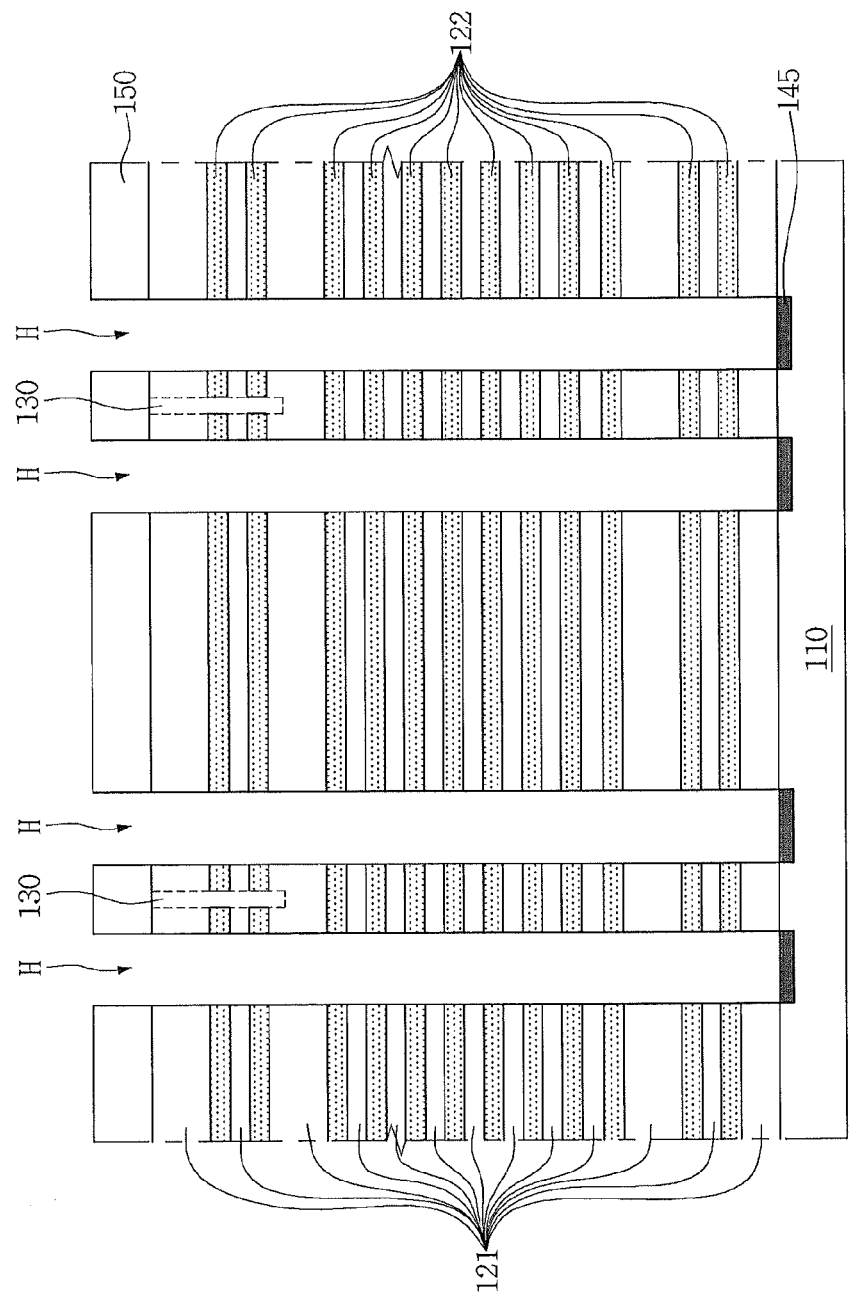

Referring to FIG. 7, operations may include performing a selective epitaxial growth (SEG) process to form a crystal growth layer 145 on the surface of the substrate 110 exposed in the channel holes H.

Figure 8:
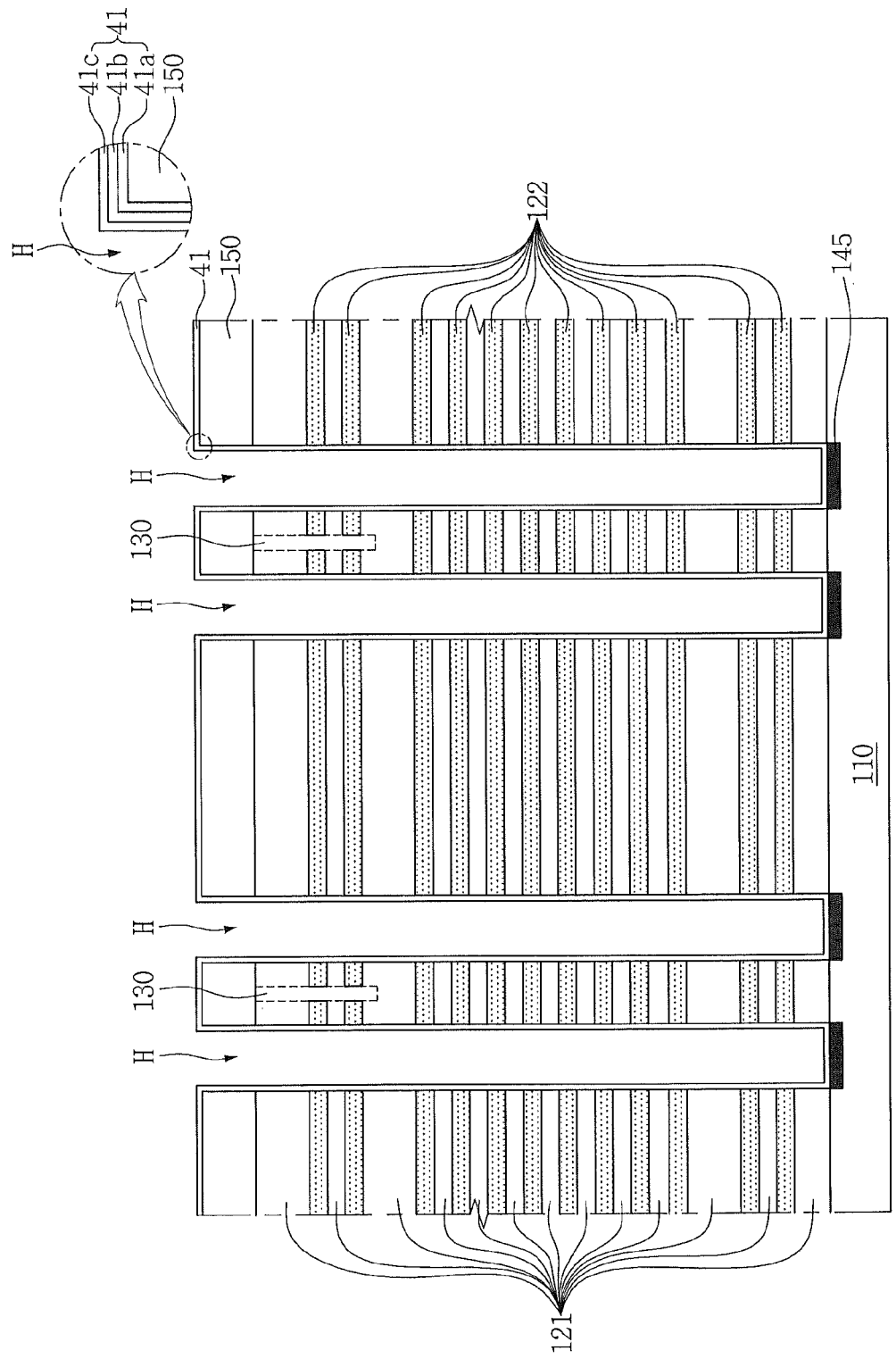

Referring to FIG. 8, operations may include conformally forming a dielectric layer 41 on the inner walls of the channel holes H. The dielectric layer 41 may include multi-layered dielectric materials. For example, the dielectric layer 41 may include a barrier dielectric layer 41a, a trap dielectric layer 41b, and a tunnel dielectric layer 41c conformally formed on the inner walls of the channel holes H. The barrier dielectric layer 41a may include, for example, silicon oxide. The trap dielectric layer 41b may include, for example, at least one of silicon nitride and a high dielectric material. The high dielectric material may include one of aluminum oxide (AlO), zirconium oxide (ZrO), hafnium oxide (HfO), or lanthanum oxide (LaO). The trap dielectric layer 41b may trap charges having information according to the operation of the semiconductor device 100. The tunnel dielectric layer 41c may include, for example, at least one of silicon oxide and N-doped silicon oxide.

Figure 9:
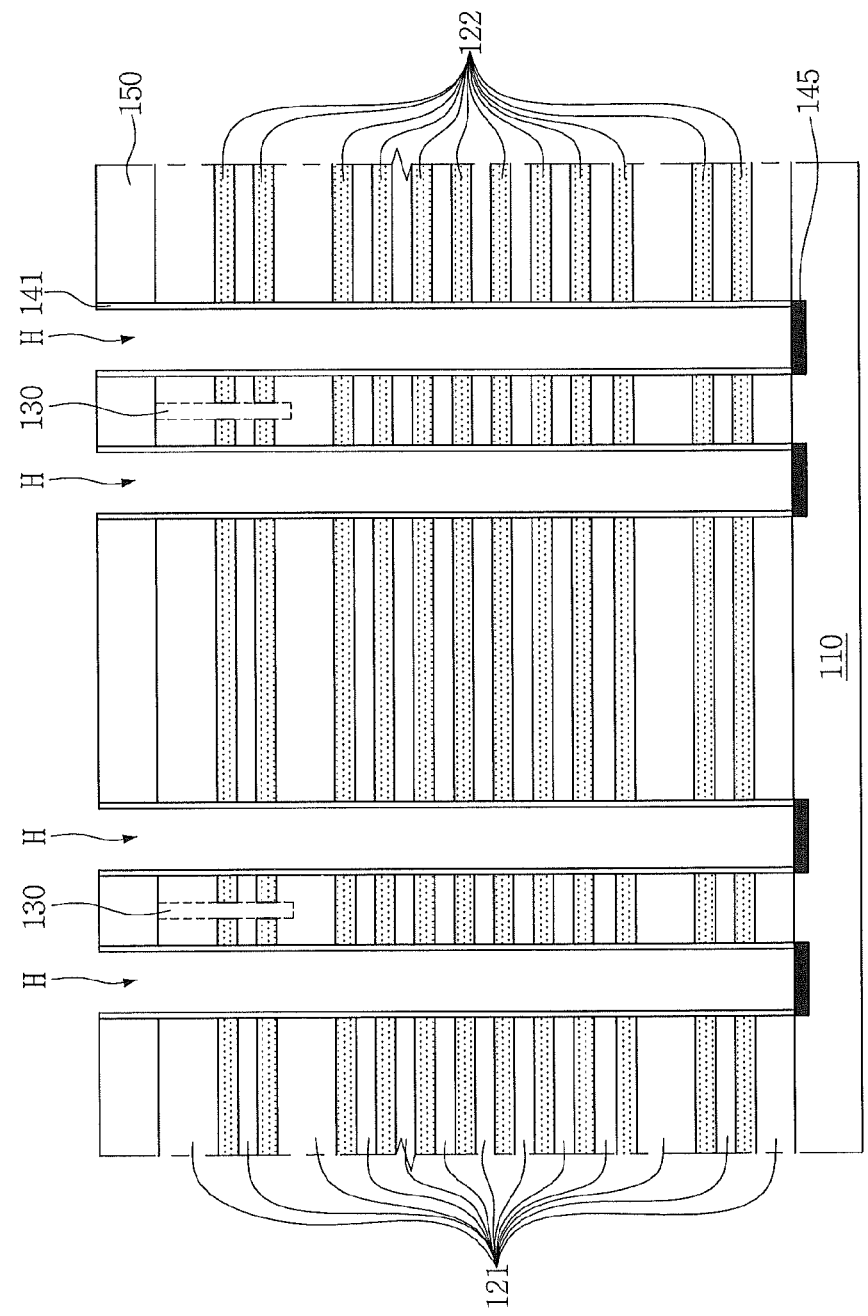

Referring to FIG. 9, operations may include performing an etch back process to expose the surface of the substrate 110 and the first capping layer 150 on bottoms of the channel holes H. During the process, the dielectric layer 41 remaining in the channel holes H may be changed to a dielectric pattern 141 including a tunnel dielectric pattern 141a, a trap dielectric pattern 141b, and a barrier dielectric pattern 141c, with reference to FIG. 2.

Figure 10:
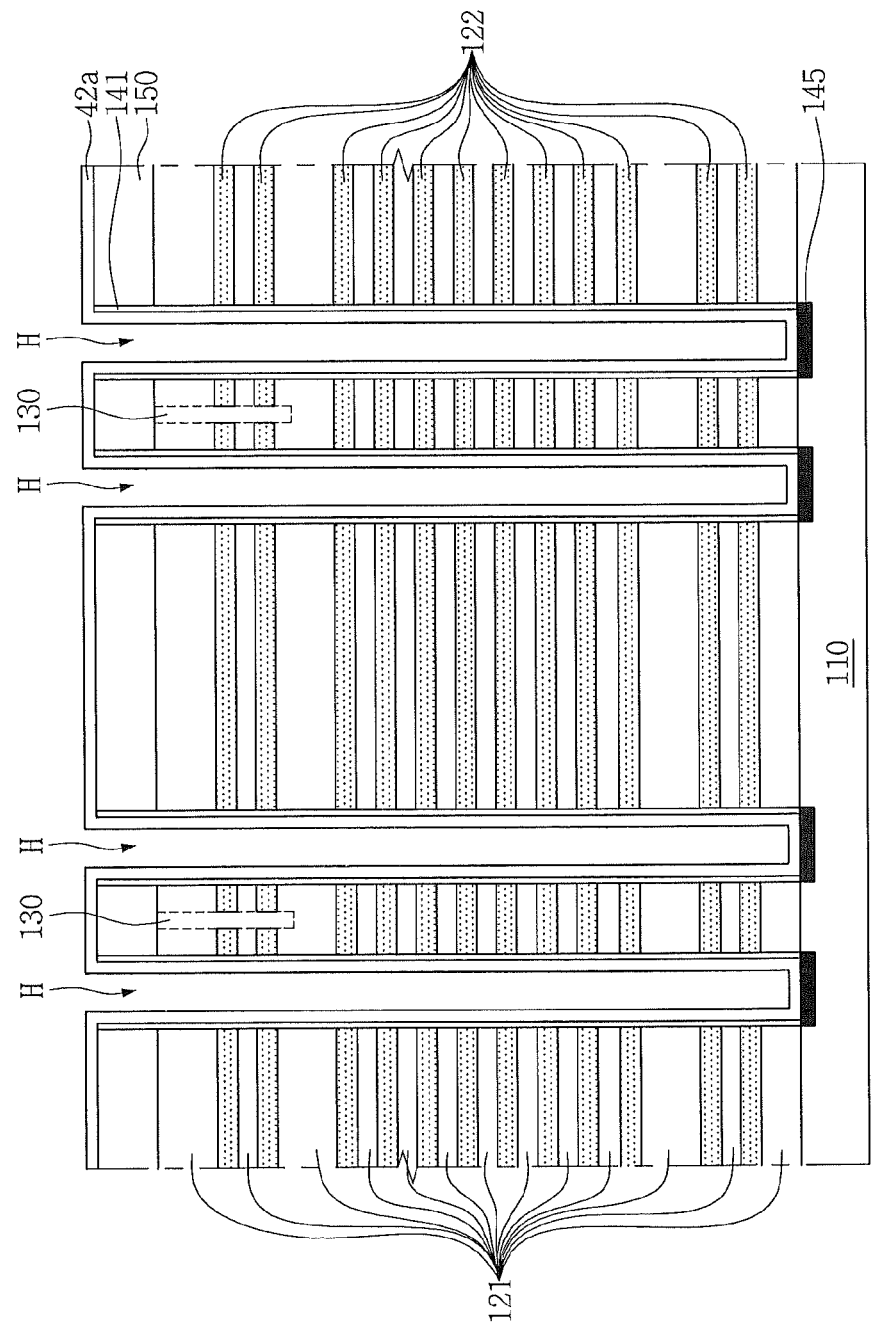

Referring to FIG. 10, operations may include conformally forming an amorphous channel active layer 42a in the channel holes H. Forming the amorphous channel active layer 42a may include conformally forming an amorphous silicon layer (a-Si) on the dielectric pattern 141 in the channel holes H by performing a deposition process.

Figure 11:
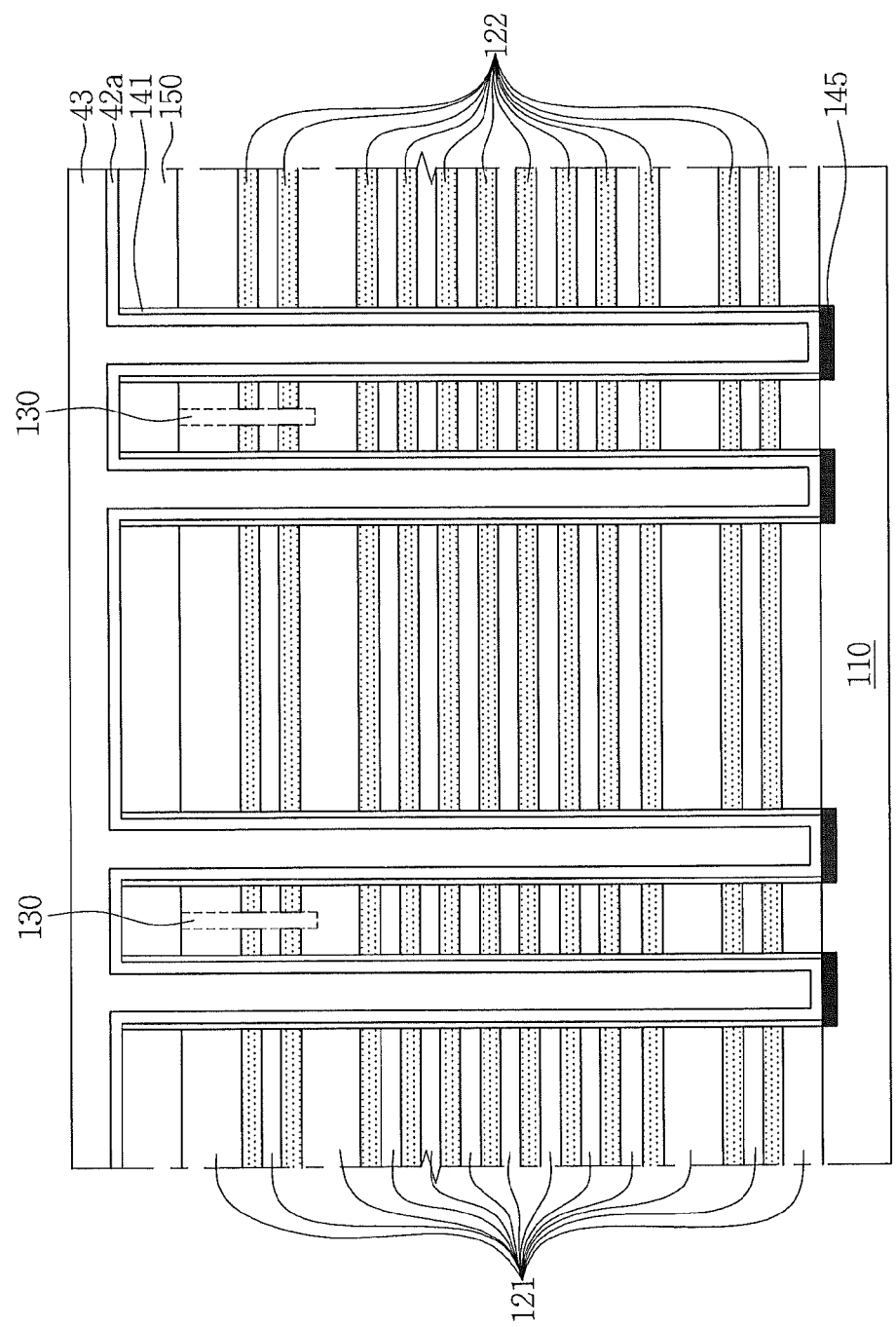

Referring to FIG. 11, operations may include forming a channel core layer 43 filling the channel holes H. Forming the channel core layer 43 may include forming an insulating material on the amorphous channel active layer 42a to fill the channel holes H. For example, the channel core layer 43 may include silicon oxide.

Figure 12:
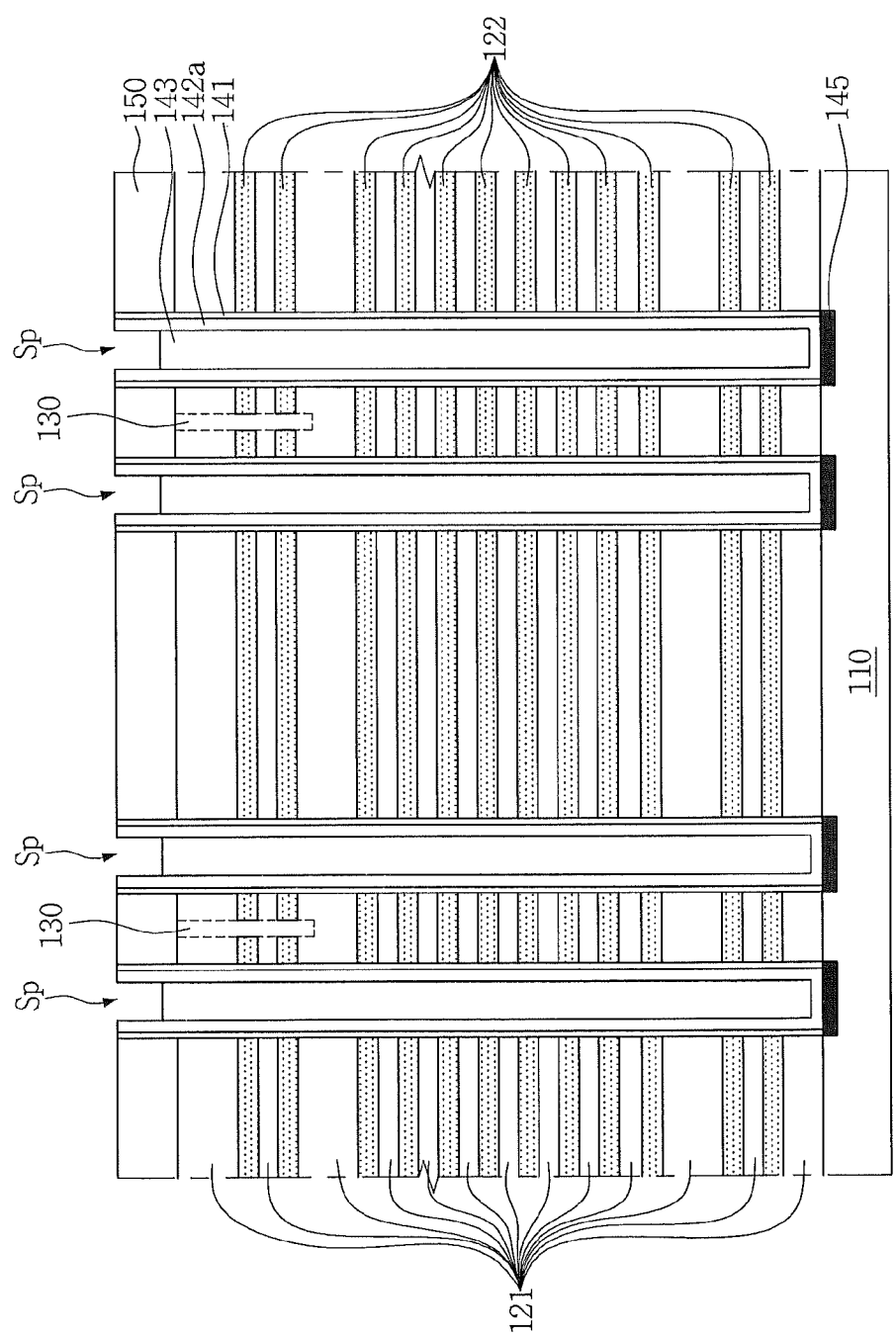

Referring to FIG. 12, operations may include performing a planarization process such as CMP, and/or an etchback process to expose the first capping layer 150, changing the channel core layer 43 and the amorphous channel active layer 42a respectively into channel core patterns 143 and amorphous channel active patterns 142a, and recessing upper portions of the channel core patterns 143 to form channel pad spaces Sp.

Figure 13:
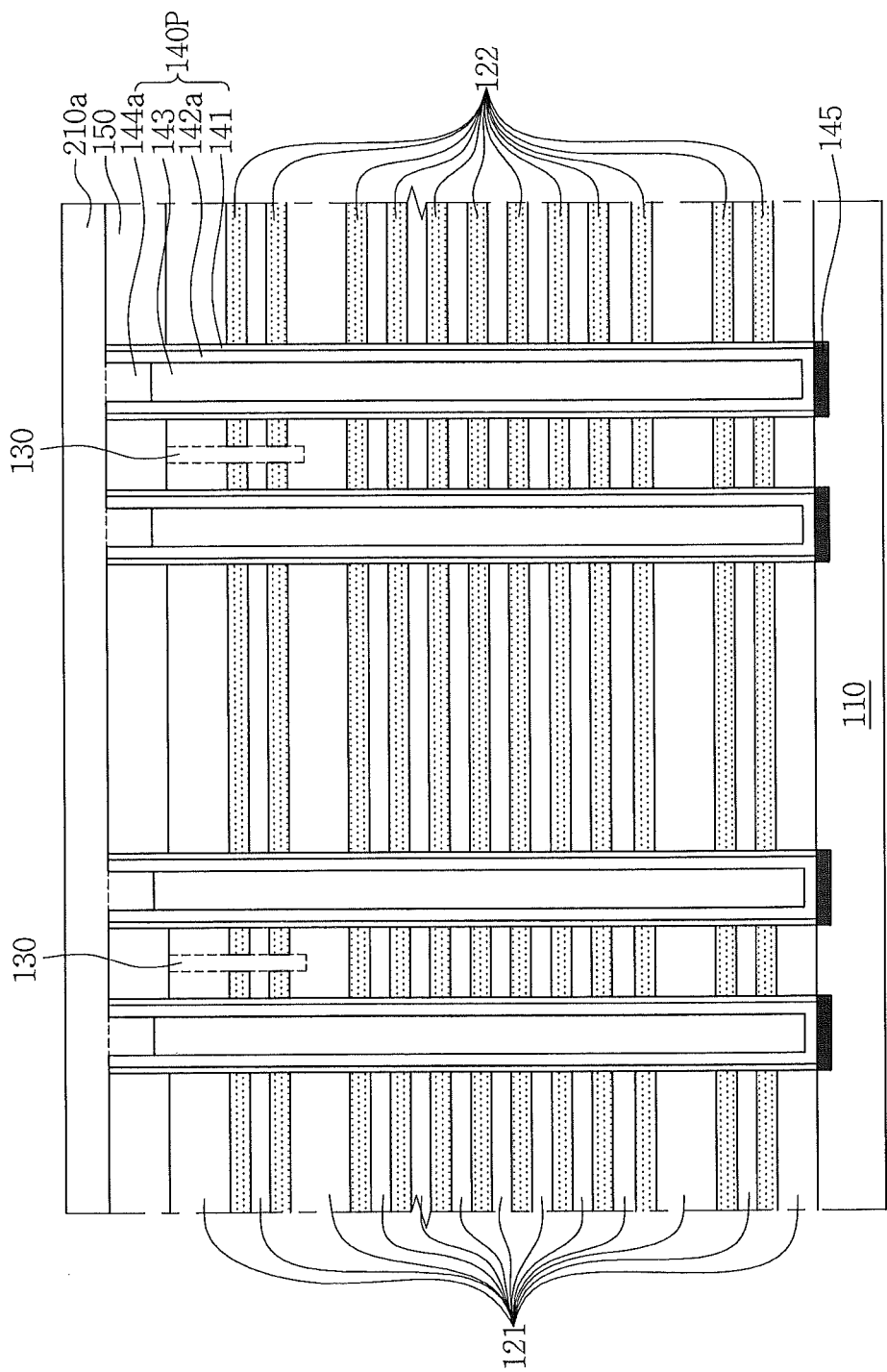

Referring to FIG. 13, operations may include forming amorphous channel pad patterns 144a in the channel pad spaces Sp, and forming an amorphous silicon layer for crystallization 210a on the first capping layer 150. Forming the amorphous channel pad patterns 144a may include forming amorphous silicon (a-Si) in the channel pad spaces Sp by performing a deposition process, etc. Forming the amorphous silicon layer for crystallization 210a may include performing a deposition process, etc. to form amorphous silicon (a-Si) on the first capping layer 150. Accordingly, the amorphous channel active patterns 142a, the amorphous channel pad patterns 144a, and the amorphous silicon layer for crystallization 210a may be materially continuous. In FIG. 13, in order to distinguish the amorphous channel pad patterns 144a from the amorphous silicon layer for crystallization 210a, boundaries therebetween are marked with dotted lines. During the process, a preliminary channel structure 140p including the dielectric pattern 141, the amorphous channel active pattern 142a, the channel core pattern 143, and the amorphous channel pad pattern 144a may be formed.

FIGS. 14A to 14D are views for describing operations in accordance with a first embodiments of the inventive subject matter. Operations may include crystallizing the amorphous silicon layer for crystallization 210a, the amorphous channel pad patterns 144a, and the amorphous channel active patterns 142a to form single-crystalline silicon (c-Si).

Figure 14A:
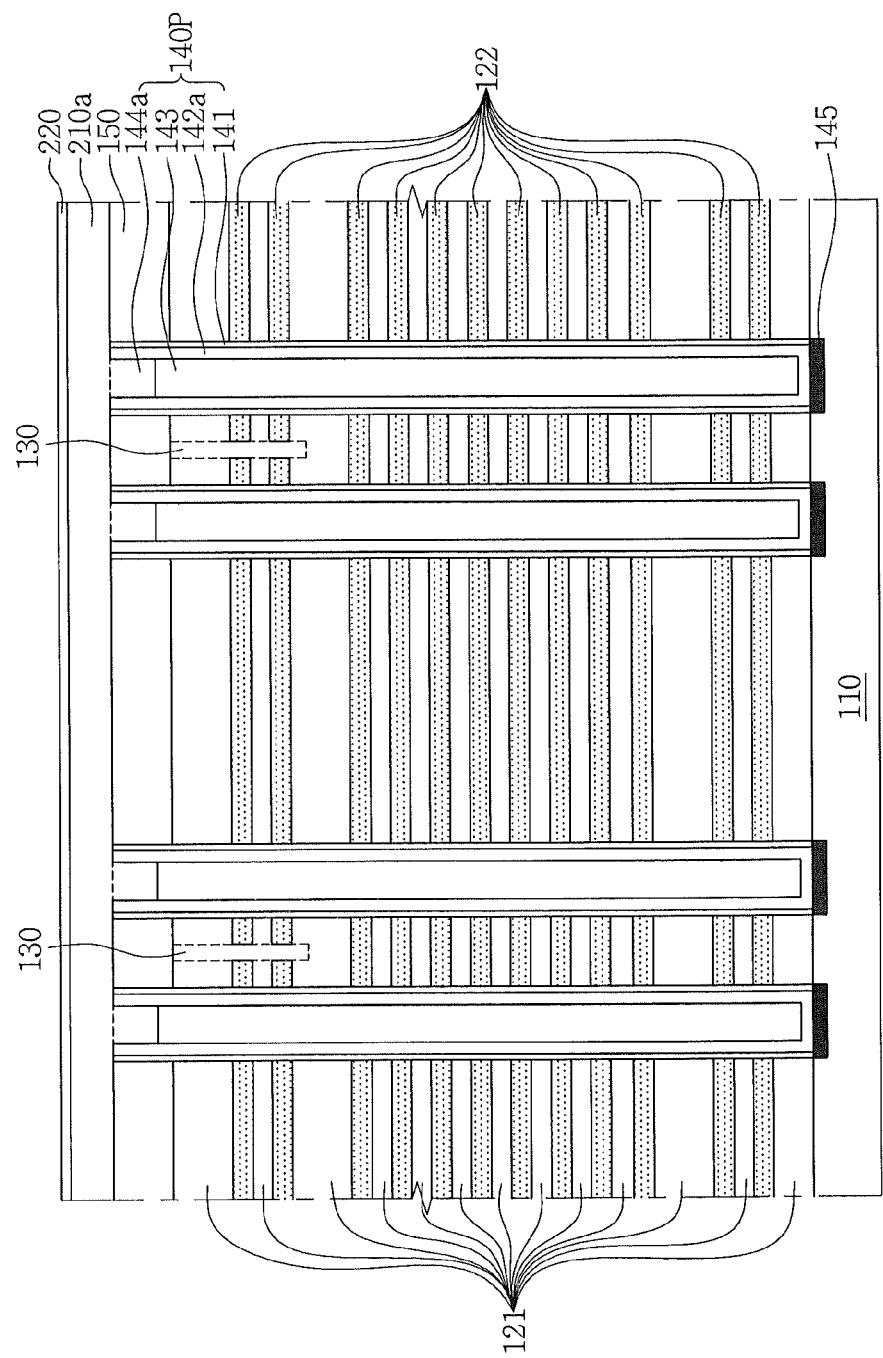

Referring to FIG. 14A, operations may include forming an insulating barrier layer 220 on the amorphous silicon layer for crystallization 210a. Forming the insulating barrier layer 220 may include forming one of silicon oxide ($SiO_2$), silicon nitride ($Si_3N_4$), and silicon oxynitride (SiON) in a thickness of about 0.5 nm to 20 nm on the amorphous silicon layer for crystallization 210a by performing a deposition process.

Figure 14B:
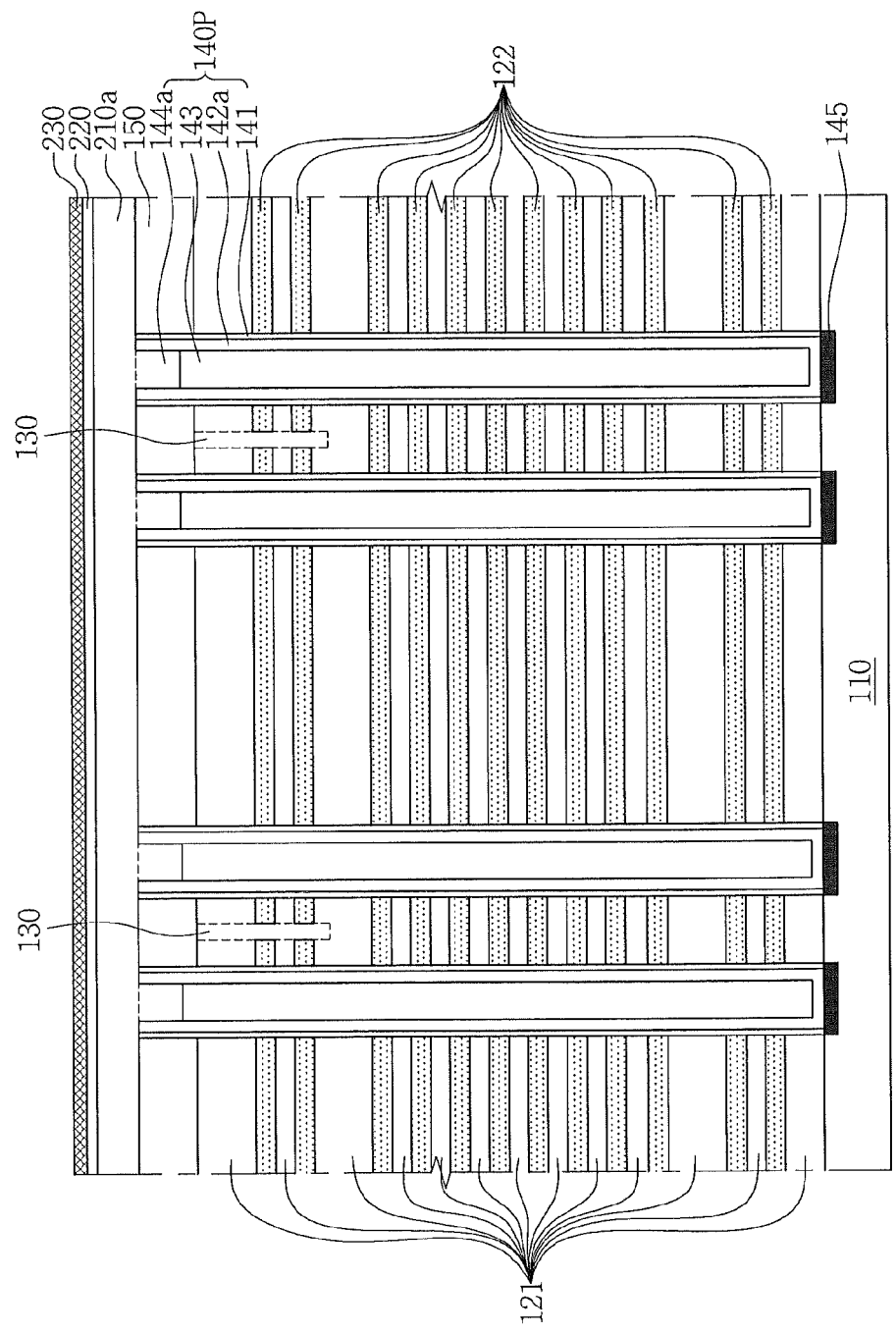

Referring to FIG. 14B, operations may include forming a metal catalytic layer 230 on the insulating barrier layer 220. Forming the metal catalytic layer 230 may include forming a metal on the insulating barrier layer 220 by performing a deposition process or a sputtering process. The metal catalytic layer 230 may include, for example, one of nickel (Ni), copper (Cu), and palladium (Pd).

Figure 14C:
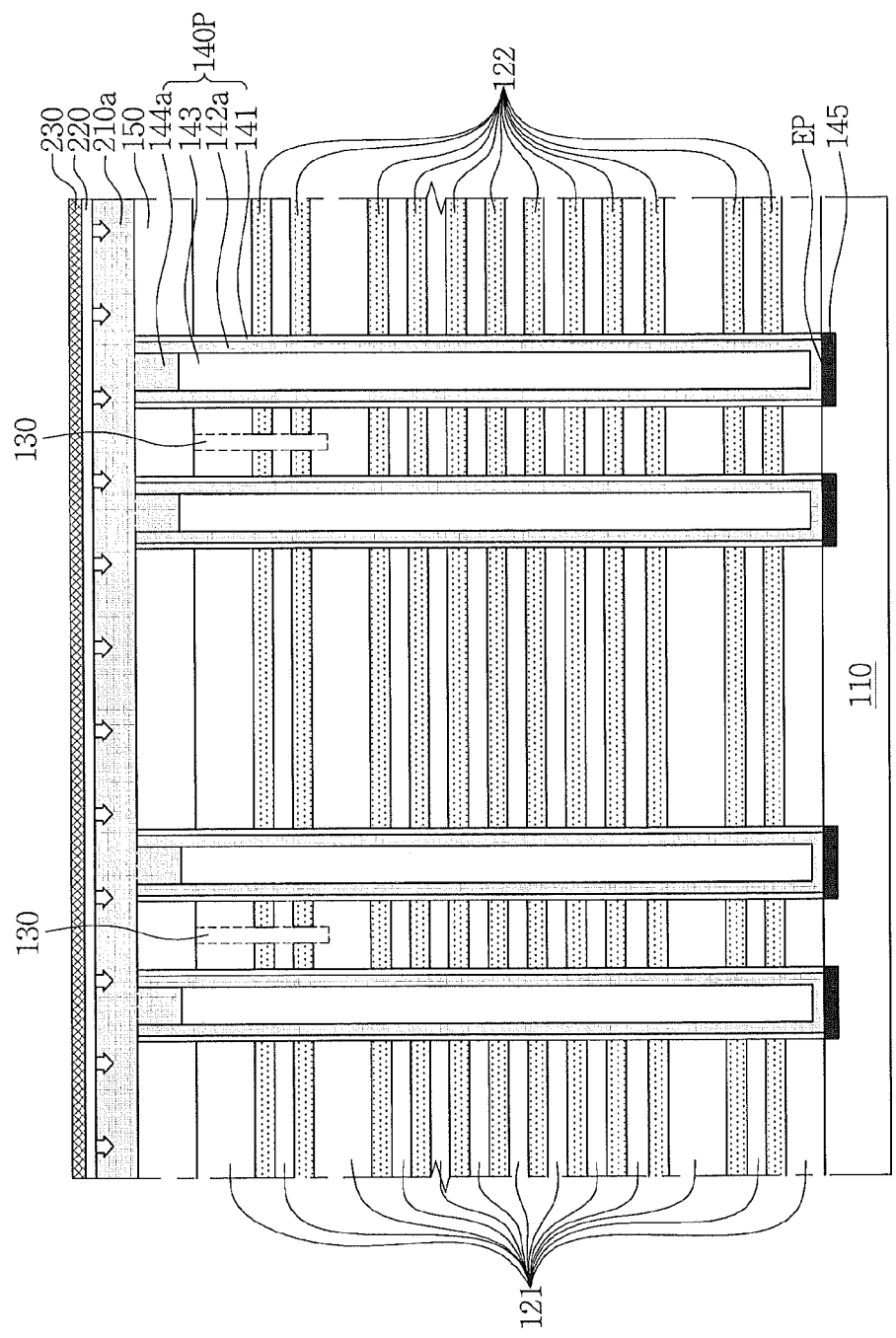

Referring to FIG. 14C, operations may include crystallizing the amorphous silicon layer for crystallization 210a, the amorphous channel pad pattern 144a, and the amorphous channel active pattern 142a to form single-crystalline silicon (c-Si) by performing an annealing process. The annealing process may be performed at about 400° C. to 650° C.

Crystallizing the amorphous silicon layer for crystallization 210a into the single-crystalline silicon may include diffusing the metal of the metal catalytic layer 230 using the annealing process in such a way that the diffused metal passes through a relatively thin insulating barrier layer 220 to be in direct contact with an upper surface of the amorphous silicon layer for crystallization 210a, crystallizing the amorphous silicon layer for crystallization 210a through metal induced crystallization (MIC), and crystallizing the amorphous channel active patterns 142a and the amorphous channel pad patterns 144a to form single-crystalline silicon through the MIC process.

More specifically, in some embodiments, the metal catalytic layer 230 is formed on the entire amorphous silicon layer for crystallization 210a. Accordingly, during the annealing process, all of the amorphous silicon layer for crystallization 210a, amorphous channel pad patterns 144a, and amorphous channel active patterns 142a which are disposed under the metal catalytic layer 230 may be single crystallized downward (that is, in the direction of white arrows) from the upper surface of the amorphous silicon layer for crystallization 210a by the MIC.

During the process, the amorphous silicon layer for crystallization 210a, the amorphous channel active patterns 142a, and the amorphous channel pad patterns 144a may be crystallized in the annealing process to be changed into a single-crystalline silicon layer 210, single-crystalline channel active patterns 142, and single-crystalline channel pad patterns 144.

Figure 14D:
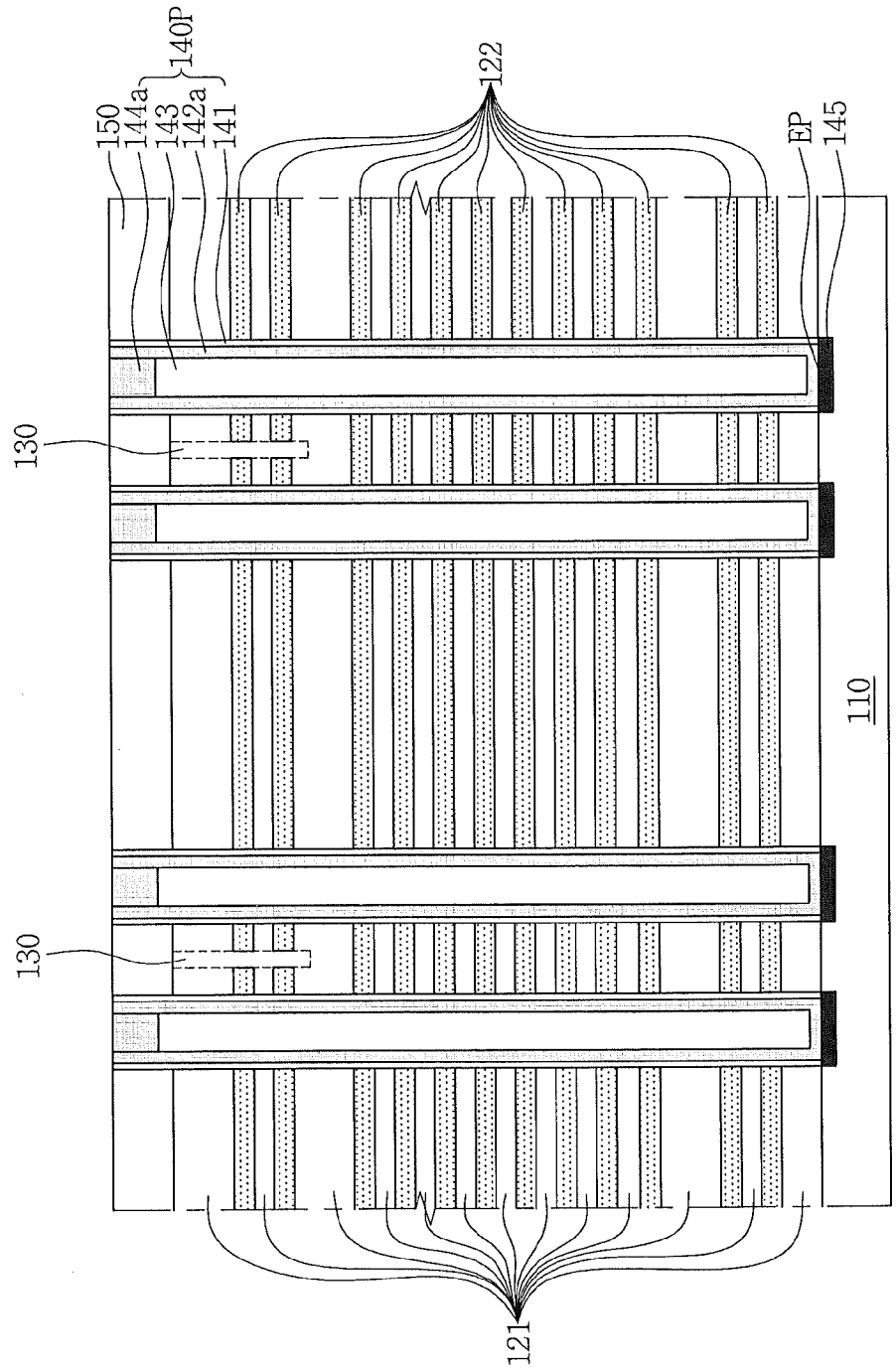

Referring to FIG. 14D, operations may include removing the metal catalytic layer 230, and performing a planarization process such as CMP to expose the first capping layer 150. During the process, a channel structure 140 including the single-crystalline channel active pattern 142, the single-crystalline channel pad pattern 144, the dielectric pattern 141, and the channel core pattern 143 may be formed.

FIGS. 15A to 15E are views for describing operations in accordance with a second embodiments of the inventive subject matter.

Figure 15A:
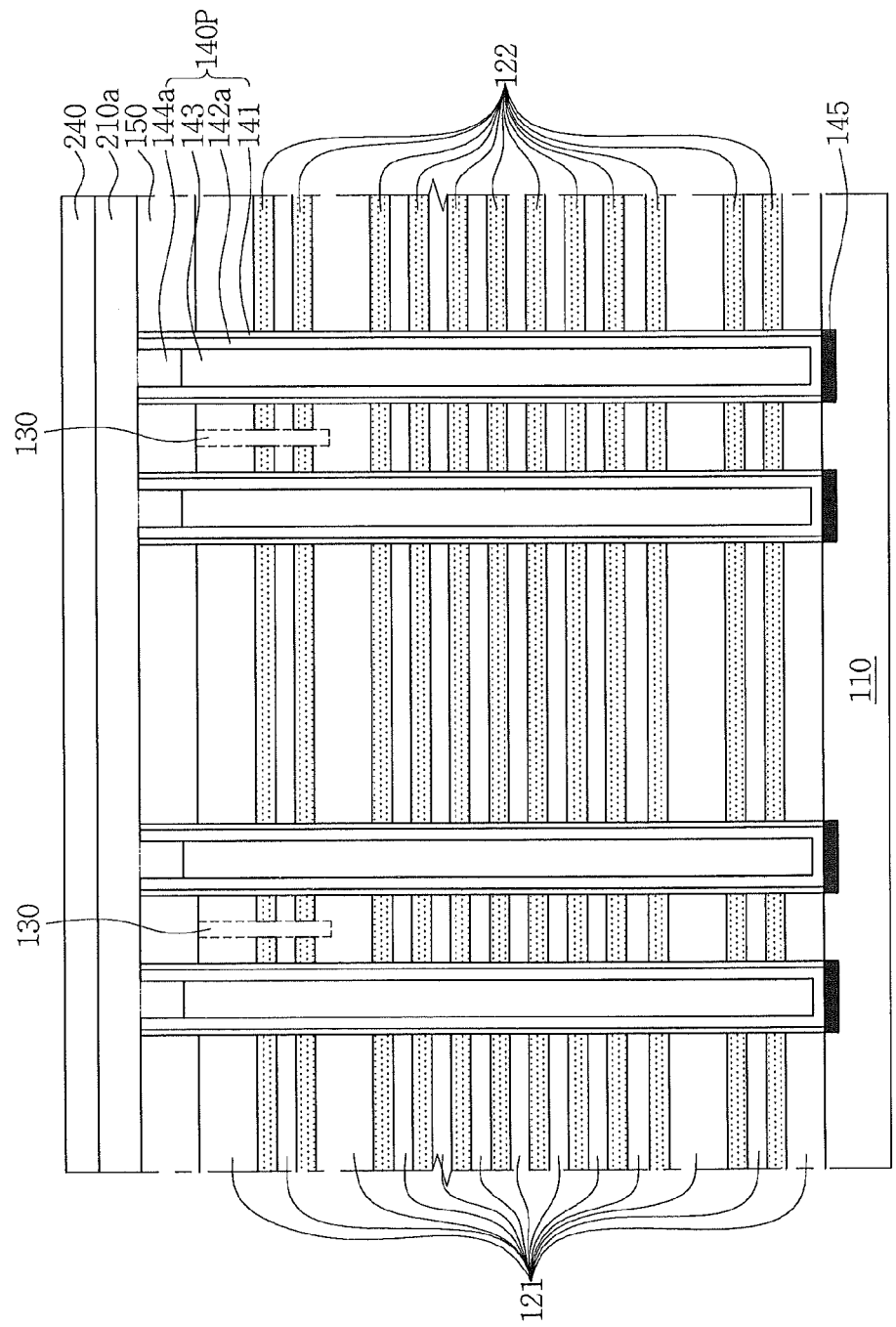

Referring to FIG. 15A, operations may include forming a mask insulating layer 240 on the amorphous silicon layer for crystallization 210a. Forming the mask insulating layer 240 may include forming one of silicon oxide ($SiO_2$), silicon nitride ($Si_3N_4$), and silicon oxynitride (SiON) to a thickness of about 20 nm or more on the entire amorphous silicon layer for crystallization 210a by performing a deposition process.

Figure 15B:
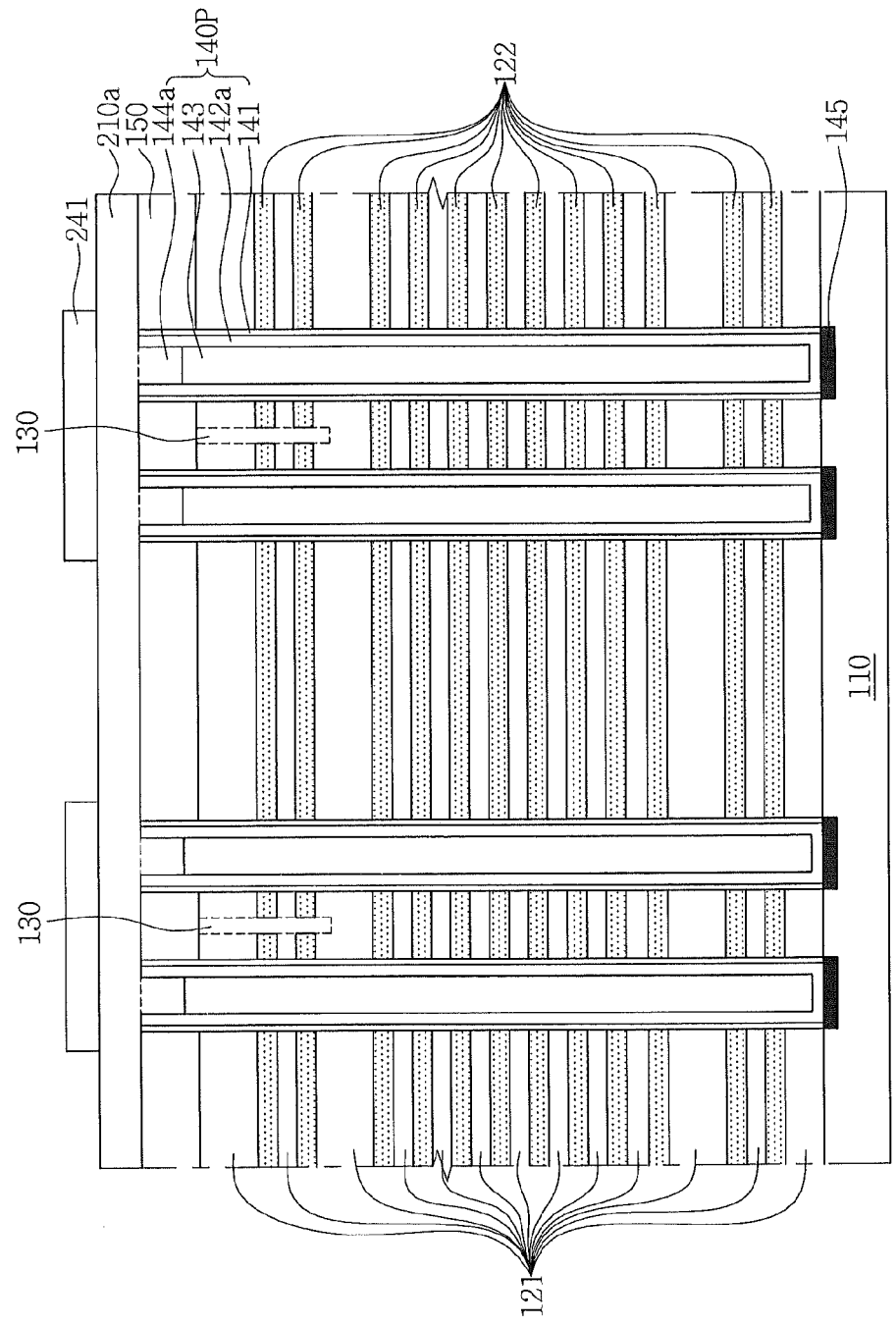

Referring to FIG. 15B, operations may include forming mask patterns 241 disposed to vertically overlap the plurality of channel holes H by removing a part of the mask insulating layer 240. Forming the mask patterns 241 may include performing an etch process to remove a part of the mask insulating layer 240 in such a way that the mask insulating layer 240 is disposed to overlap the channel holes H, and thereby exposing a part of a surface of the amorphous silicon layer for crystallization 210a.

Figure 15C:
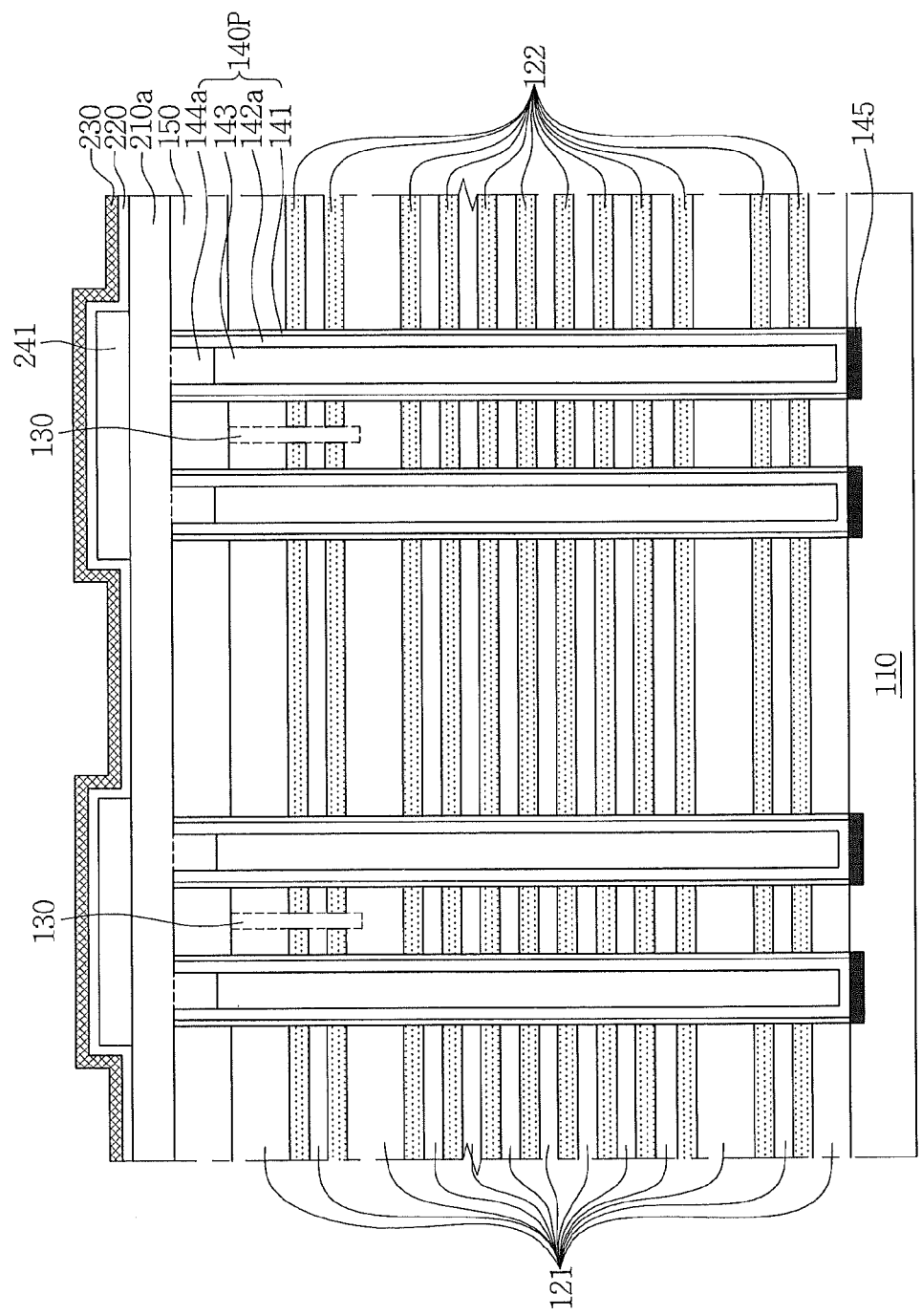

Referring to FIG. 15C, operations may include forming an insulating barrier layer 220 fully covering surfaces of the amorphous silicon layer for crystallization 210a and the mask patterns 241, and forming a metal catalytic layer 230 on the insulating barrier layer 220. Forming the insulating barrier layer 220 may include forming one of silicon oxide ($SiO_2$), silicon nitride ($Si_3N_4$), and silicon oxynitride (SiON) to a thickness of about 0.5 nm to 20 nm on the entire surfaces of the amorphous silicon layer for crystallization 210a and the mask patterns 241 by performing a deposition process. Forming the metal catalytic layer 230 may include forming a metal on the insulating barrier layer 220 by performing a deposition process or a sputtering process. The metal catalytic layer 230 may include, for example, one of nickel (Ni), copper (Cu), and palladium (Pd).

Figure 15D:
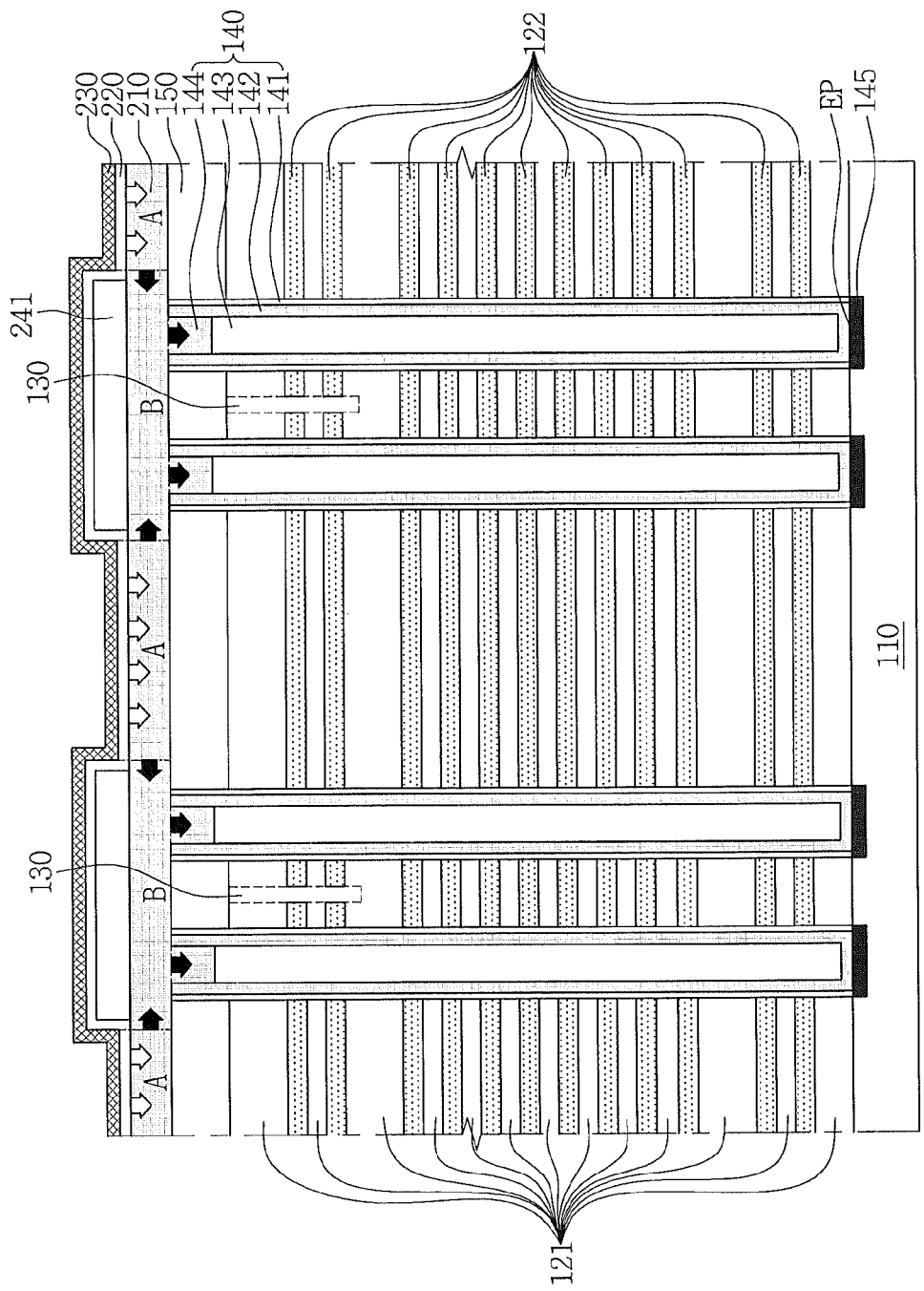

Referring to FIG. 15D, operations may include crystallizing the amorphous silicon layer for crystallization 210a, the amorphous channel pad pattern 144a, and the amorphous channel active pattern 142a into single-crystalline silicon (c-Si) by performing an annealing process. The annealing process may be performed at a temperature of about 400° C. to 650° C.

Crystallizing the amorphous silicon layer for crystallization 210a into single-crystalline silicon works as follows. A metal of the metal catalytic layer 230 may be diffused in the annealing process. The diffused metal may pass through the relatively thin insulating barrier layer 220 to be in direct contact with portions of an upper surface of the amorphous silicon layer for crystallization 210a. First areas A including the portions of the upper surface of the amorphous silicon layer for crystallization 210a may be crystallized into single-crystalline silicon by MIC, and second areas B which do not include the portions of the upper surface of the amorphous silicon layer for crystallization 210a may be crystallized into single-crystalline silicon by metal induced lateral crystallization (MILC). The amorphous channel active patterns 142a and the amorphous channel pad patterns 144a may be crystallized into single-crystalline silicon by the MILC.

More specifically, in some embodiments, the relatively thick mask patterns 241 may be partially interposed between the metal catalytic layer 230 and the amorphous silicon layer for crystallization 210a. Thus, the amorphous silicon layer for crystallization 210a may include the first areas A in direct contact with the metal diffused from the metal catalytic layer 230, and the second areas B which are not in contact with the metal diffused from the metal catalytic layer 230 due to the mask patterns 241. Accordingly, during the annealing process, the first areas A may be single crystallized downward (that is, in the direction of white arrows) from the portions of the upper surface of the amorphous silicon layer for crystallization 210a by the MIC, and the second areas B may be single crystallized laterally (for example, in the direction of left and/or right pointing arrows among black arrows) from boundaries of the first areas A by the MILC. In addition, the amorphous channel active patterns 142a and amorphous channel pad patterns 144a disposed under the mask patterns 241 may be single crystallized laterally (for example, in the direction of downward pointing arrows among the black arrows) from boundaries of the second areas B by the MILC.

In this process, the amorphous silicon layer for crystallization 210a, the amorphous channel active patterns 142a, and the amorphous channel pad patterns 144a may be crystallized to be changed into a single-crystalline silicon layer 210, single-crystalline channel active patterns 142, and single-crystalline channel pad patterns 144 in the annealing process.

Single-crystalline silicon crystallized by the MILC may have a greater grain size than single-crystalline silicon crystallized by the MIC. Further, single-crystalline silicon crystallized by the MILC may have about one hundredth of a lower metal concentration than single-crystalline silicon crystallized by the MIC.

Figure 15E:
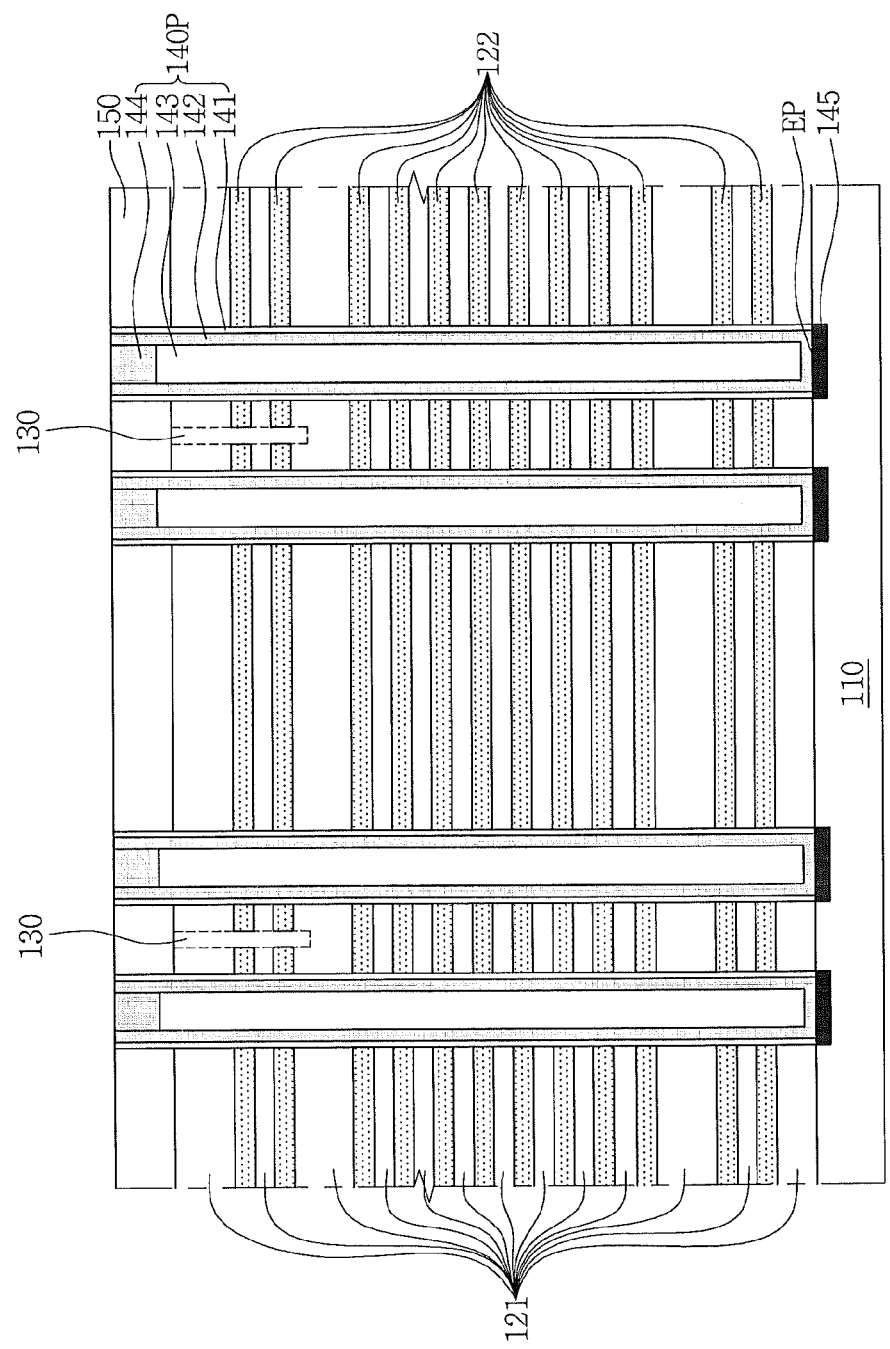

Referring to FIG. 15E, operations may include removing the metal catalytic layer 230, and performing a planarization process such as CMP to expose the first capping layer 150. During the process, a channel structure 140 including the single-crystalline channel active pattern 142, the single-crystalline channel pad pattern 144, the dielectric pattern 141, and the channel core pattern 143 may be formed.

Figure 16A:
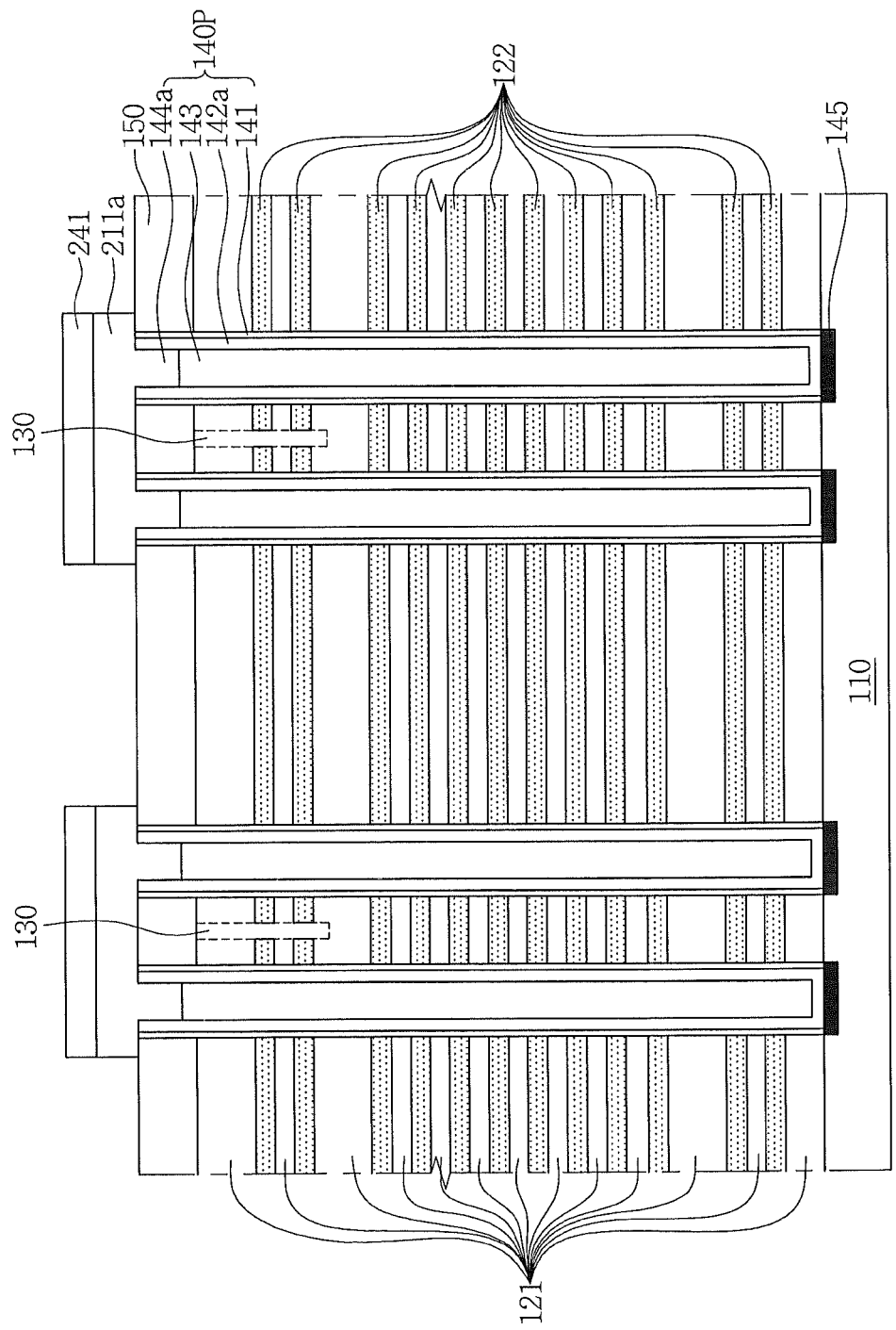
Figure 16B:
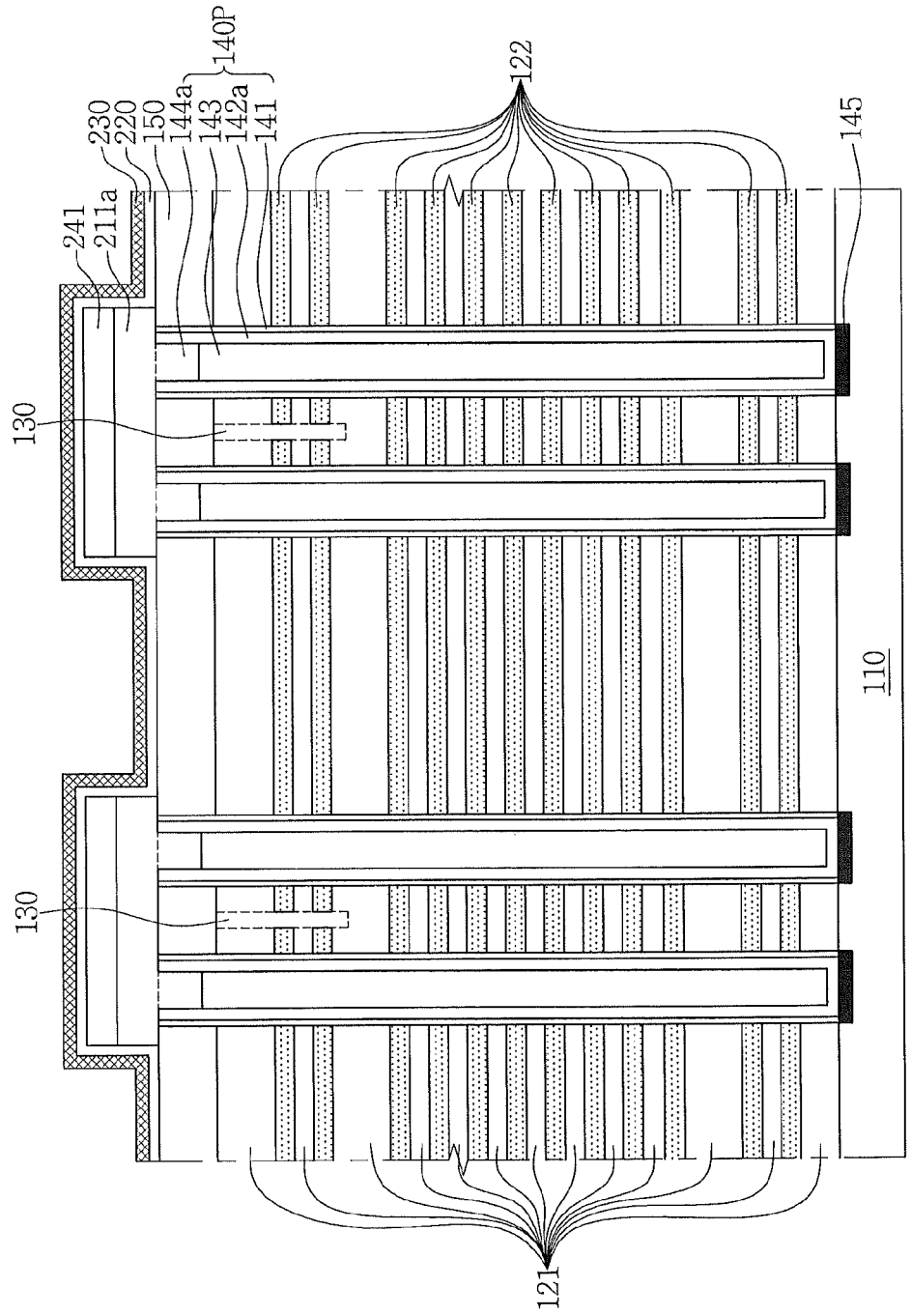
Figure 16C:
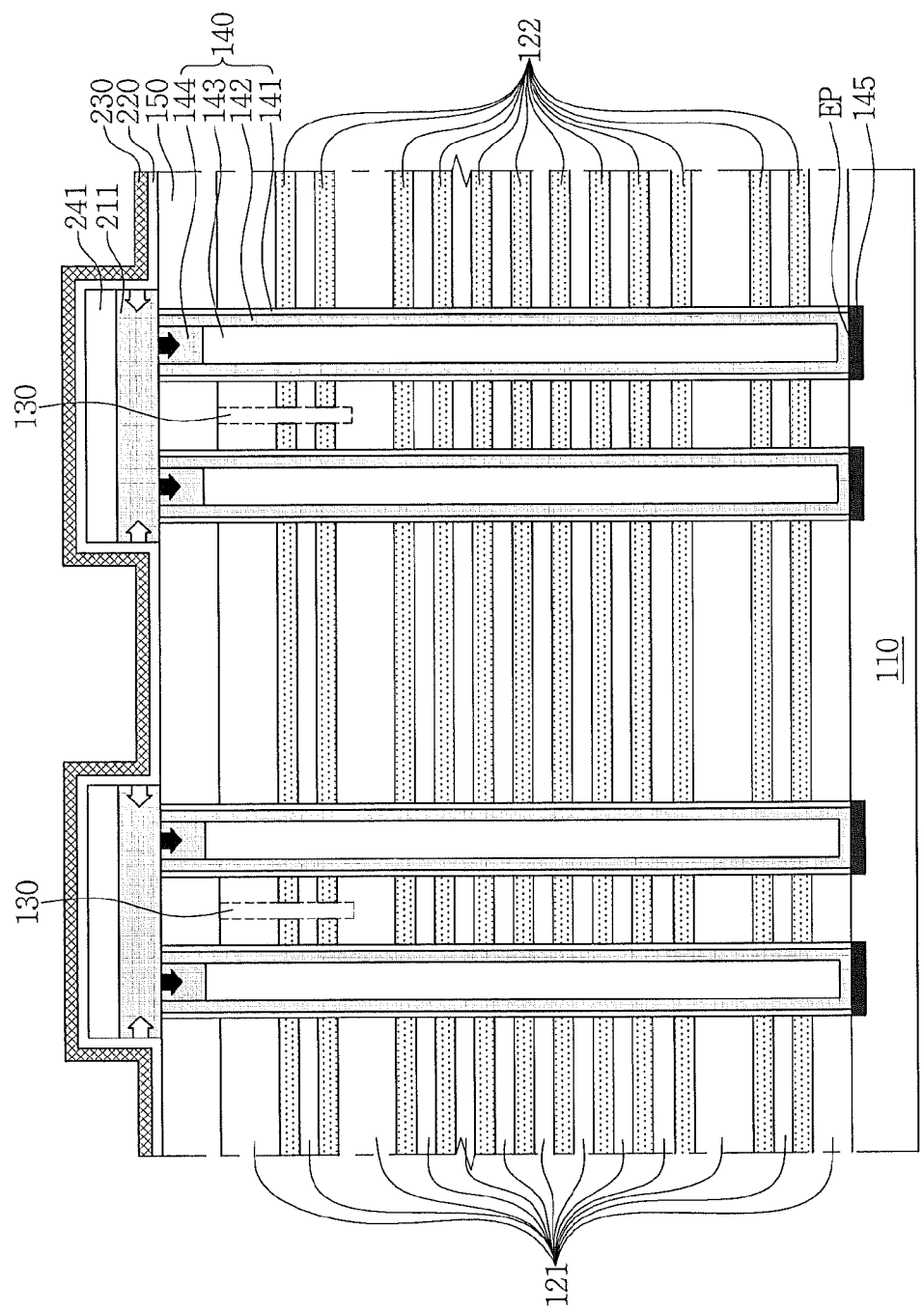

FIGS. 16A to 16C are views for describing operations in accordance with a third embodiments of the inventive subject matter.

Referring to FIGS. 15A, 15B, and 16A, operations may include forming a mask insulating layer 240 on the amorphous silicon layer for crystallization 210a, and forming amorphous silicon patterns for crystallization 211a and mask patterns 241 which are disposed to vertically overlap the plurality of channel holes H and have exposed side surfaces, by removing parts of the amorphous silicon layer for crystallization 210a and the mask insulating layer 240.

Referring to FIG. 16B, operations may include forming an insulating barrier layer 220 covering the entire surfaces of the first capping layer 150, the amorphous silicon patterns for crystallization 211a, and the mask patterns 241, and forming a metal catalytic layer 230 on the insulating barrier layer 220. Forming the insulating barrier layer 220 may include forming silicon oxide ($SiO_2$), silicon nitride ($Si_3N_4$), or silicon oxynitride (SiON) to a thickness of about 0.5 nm to 20 nm on the entire surfaces of the first capping layer 150, the amorphous silicon patterns for crystallization 211a, and the mask patterns 241 by performing a deposition process. Forming the metal catalytic layer 230 may include forming a metal on the insulating barrier layer 220 by performing a deposition process or a sputtering process. The metal used in forming the metal catalytic layer 230 may include, for example, one of nickel (Ni), copper (Cu), and palladium (Pd).

Referring to FIG. 16C, operations may include crystallizing the amorphous silicon layer for crystallization 210a, the amorphous channel active patterns 142a, and the amorphous channel pad patterns 144a into single-crystalline silicon (c-Si) by performing an annealing process. The annealing process may be performed at about 400° C. to 650° C.

The crystallization into single-crystalline silicon works as follows. A metal of the metal catalytic layer 230 is diffused in the annealing process, the diffused metal passes through the relatively thin insulating barrier layer 220 to be in direct contact with side surfaces of the amorphous silicon patterns for crystallization 211a, the amorphous silicon patterns for crystallization 211a are crystallized into single-crystalline silicon by MIC, and the amorphous channel active patterns 142a and the amorphous channel pad patterns 144a are crystallized into single-crystalline silicon by MILC.

More specifically, in some embodiments, the relatively thick mask patterns 241 are interposed between upper surfaces of the amorphous silicon patterns for crystallization 211a and the metal catalytic layer 230, and the relatively thin insulating barrier layer 220 is interposed between the side surfaces of the amorphous silicon patterns for crystallization 211a and the metal catalytic layer 230. Accordingly, during the annealing process, the amorphous silicon patterns for crystallization 211a may be single crystallized in the left and/or right directions (that is, in the direction of white arrows) from the side surfaces thereof by the MIC. In addition, the amorphous channel active patterns 142a and amorphous channel pad patterns 144a disposed under the mask patterns 241 may be single crystallized laterally (for example, in the direction of the black arrows) from boundaries of single crystallized areas.

In this process, the amorphous silicon patterns for crystallization 211a, the amorphous channel active patterns 142a, and the amorphous channel pad patterns 144a may be crystallized to be changed into single-crystalline silicon patterns 211, single-crystalline channel active patterns 142, and single-crystalline channel pad patterns 144 in the annealing process.

Next, the processes described with reference to FIG. 15E may be performed.

FIGS. 17A to 17D are views for describing operations in accordance with a fourth embodiments of the inventive subject matter.

Figure 17A:
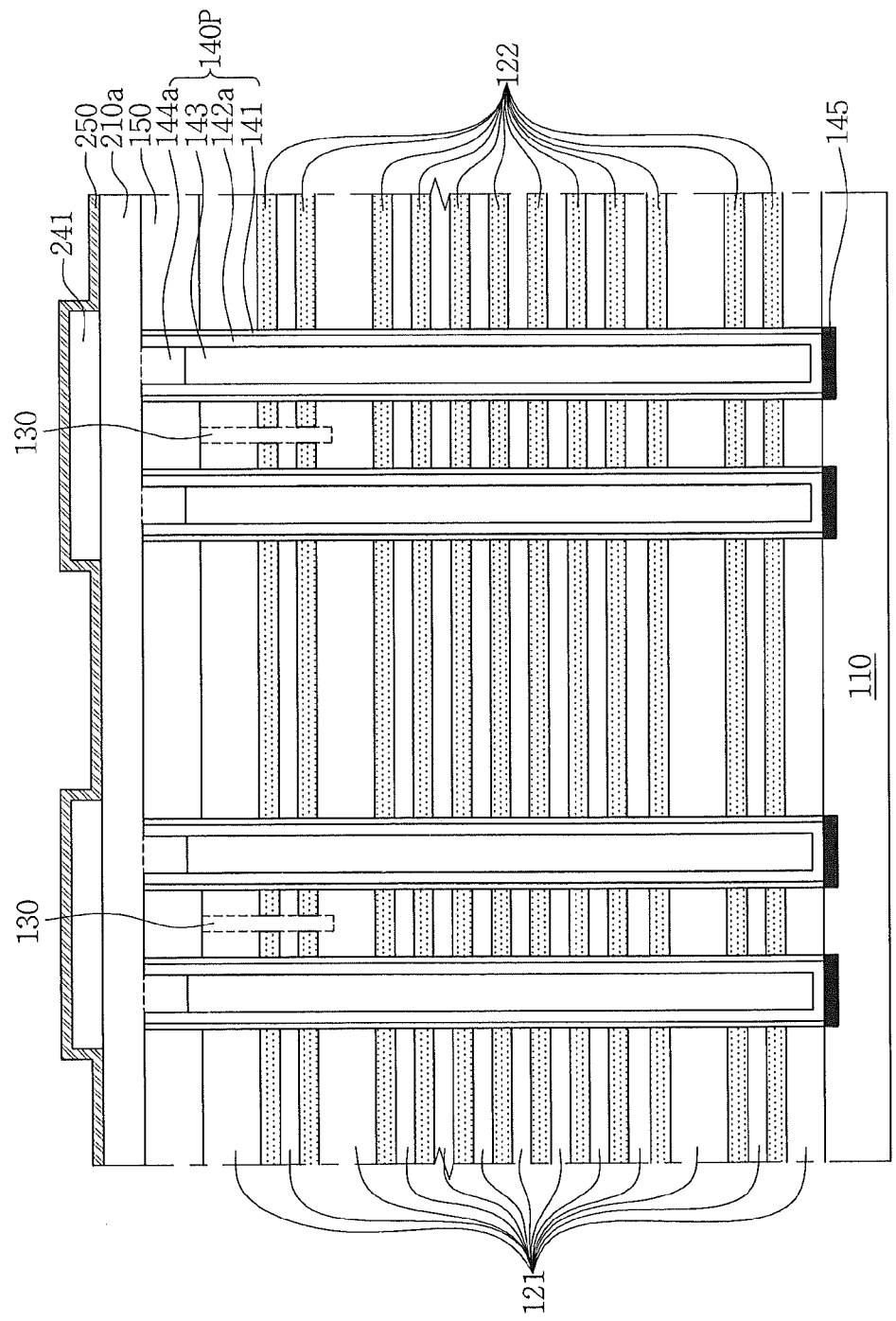

Referring to FIGS. 15A, 15B, and 17A, operations may include forming a mask insulating layer 240 on the amorphous silicon layer for crystallization 210a, removing parts of the mask insulating layer 240 to form mask patterns 241 which are disposed to vertically overlap the plurality of channel holes H, and forming a metal layer for silicidation 250 covering the entire surfaces of the amorphous silicon layer for crystallization 210a and mask patterns 241.

In some embodiments, the mask patterns 241 may function to prevent the amorphous silicon layer for crystallization 210a from being in direct contact with the metal layer for silicidation 250 and thereby forming a metal silicide layer 260 on preliminary channel structures 140p during the silicidation process.

Forming the metal layer for silicidation 250 may include forming a metal on the entire surfaces of the amorphous silicon layer for crystallization 210a and the mask patterns 241 by performing a deposition process or a sputtering process. The metal layer for silicidation 250 may include, for example, one of nickel (Ni), copper (Cu), and palladium (Pd).

Figure 17B:
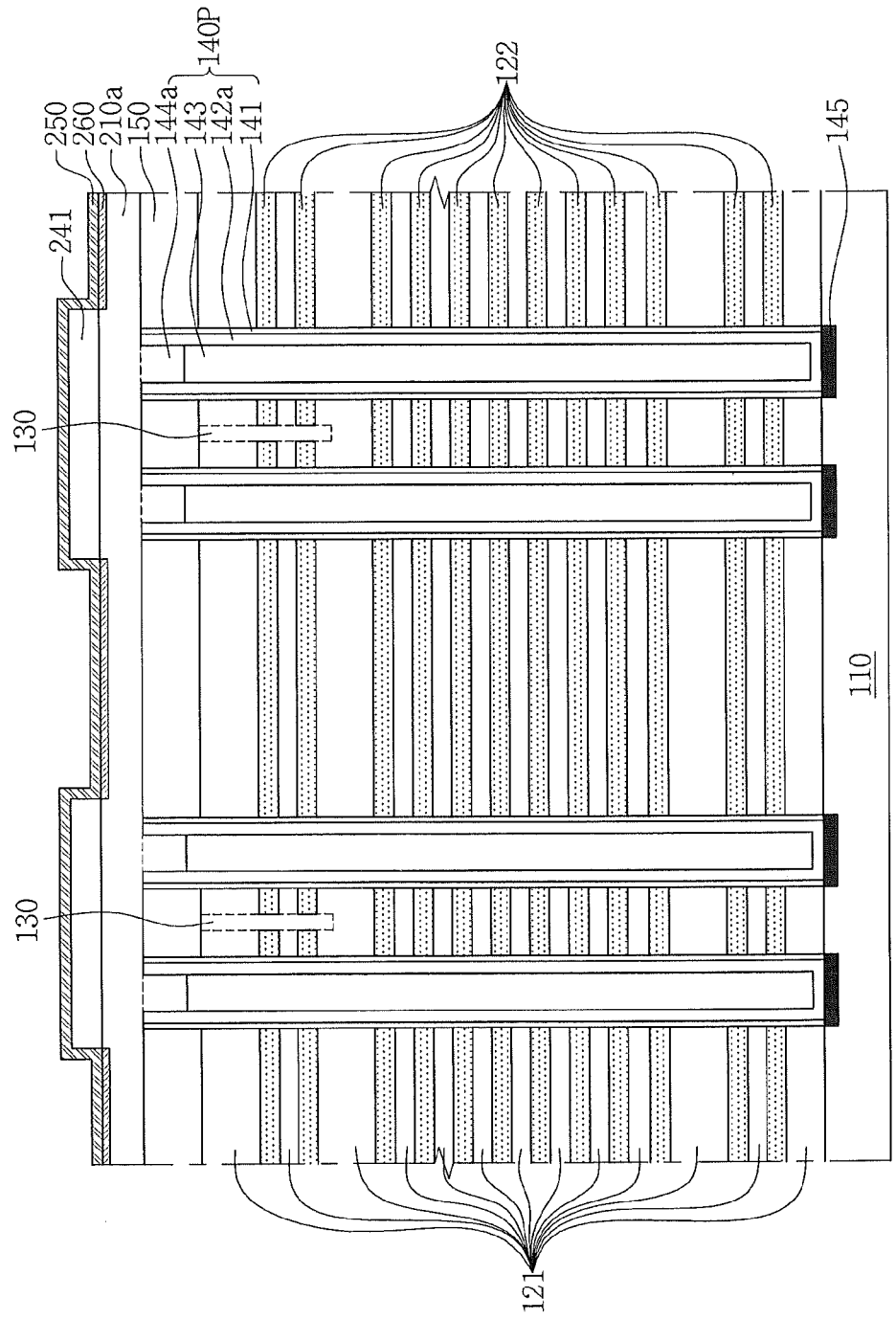

Referring to FIG. 17B, operations may include forming a metal silicide layer 260 by performing a silicidation process. The metal silicide layer 260 may be formed in an area in which the metal layer for silicidation 250 is in direct contact with an upper surface of the amorphous silicon layer for crystallization 210a by performing heat treatment for 3 to 5 minutes at about 350° C. to 450° C. The metal silicide layer 260 may include, for example, one of $NiSi_x$, $CuSi_x$, and $PdSi_x$.

Figure 17C:
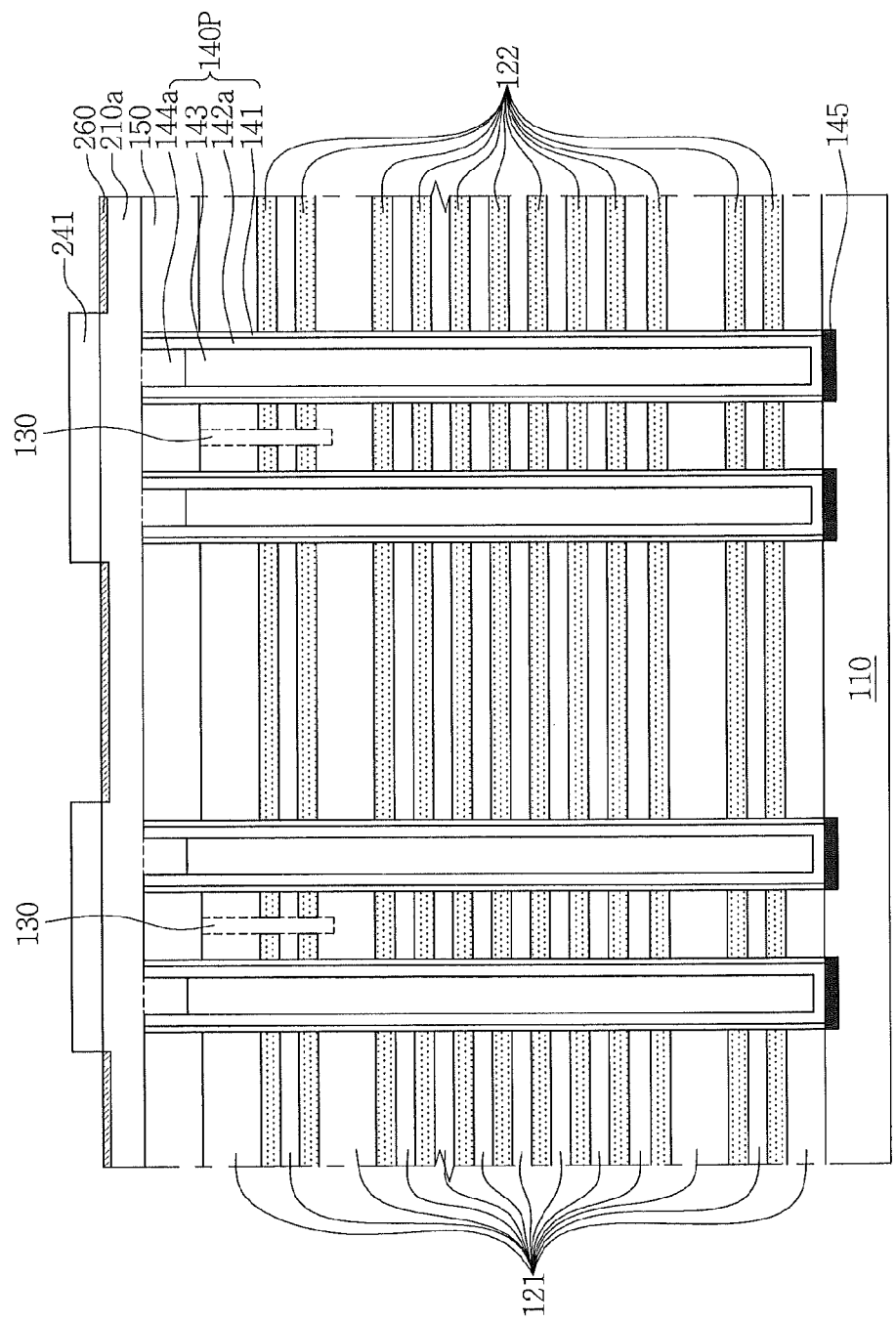

Referring to FIG. 17C, operations may include removing the metal layer for silicidation 250.

In some embodiments and a following embodiment, while performing an annealing process using the metal silicide layer 260 as a metal catalyst, single crystallization by the MIC and the MILC may proceed.

Figure 17D:
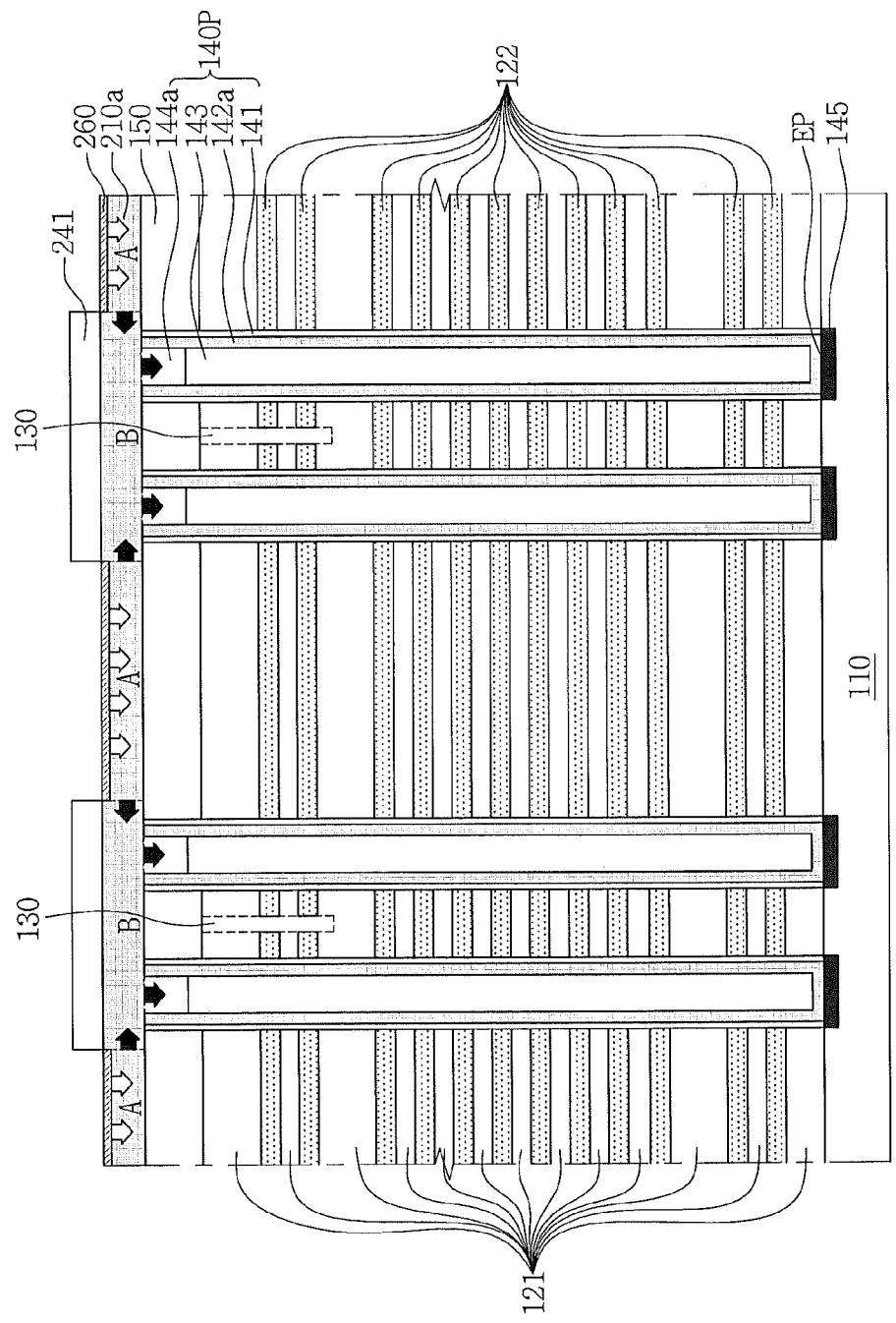

Referring to FIG. 17D, operations may include performing an annealing process to crystallize the amorphous silicon layer for crystallization 210a, the amorphous channel active patterns 142a, and the amorphous channel pad patterns 144a into single-crystalline silicon (c-Si). The annealing process may be performed at a temperature of about 400° C. to 650° C.

The crystallization into single-crystalline silicon works as follows. A metal of the metal silicide layer 260 is diffused in the annealing process, the diffused metal is in direct contact with parts of the upper surface of the amorphous silicon layer for crystallization 210a, first areas A including the portions of the upper surface of the amorphous silicon layer for crystallization 210a are crystallized into single-crystalline silicon by MIC, second areas B which do not include the portions of the upper surface of the amorphous silicon layer for crystallization 210a are crystallized into single-crystalline silicon by MILC, and the amorphous channel active patterns 142a and the amorphous channel pad patterns 144a are crystallized into single-crystalline silicon by the MILC.

More specifically, in some embodiments, the metal silicide layer 260 is partially formed on the upper surface of the amorphous silicon layer for crystallization 210a. Thus, the amorphous silicon layer for crystallization 210a may include the first areas A in direct contact with the metal diffused from the metal silicide layer 260, and the second areas B which are not in direct contact with the metal diffused from the metal silicide layer 260 during the annealing process. Accordingly, during the annealing process, the first areas A may be single crystallized downward (that is, in the direction of white arrows) from the parts of the upper surface of the amorphous silicon layer for crystallization 210a by the MIC, and the second areas B may be single crystallized laterally (for example, in the direction of left and/or right pointing arrows among black arrows) from boundaries of the first areas A by the MILC. In addition, the amorphous channel active patterns 142a and amorphous channel pad patterns 144a disposed under the mask patterns 241 may be single crystallized laterally (for example, in the direction of downward pointing arrows among the black arrows) from boundaries of the second areas B by the MILC.

In this process, the amorphous silicon layer for crystallization 210a, the amorphous channel active patterns 142a, and the amorphous channel pad patterns 144a may be crystallized to be changed into a single-crystalline silicon layer 210, single-crystalline channel active patterns 142, and single-crystalline channel pad patterns 144 in the annealing process.

Next, the processes described with reference to FIG. 15E may be performed.

FIGS. 18A to 18D are views for describing operations in accordance with a fifth embodiments of the inventive subject matter.

Referring to FIGS. 15A, 15B, 16A, and 18A, operations may include forming a mask insulating layer 240 on the amorphous silicon layer for crystallization 210a, removing parts of the amorphous silicon layer for crystallization 210a and mask insulating layer 240 to form amorphous silicon patterns for crystallization 211a and mask patterns 241 which are disposed to vertically overlap the plurality of channel holes H and have exposed side surfaces, and forming a metal layer for silicidation 250 covering the entire surfaces of the first capping layer 150, the amorphous silicon patterns for crystallization 211a, and the mask patterns 241.

Forming the metal layer for silicidation 250 may include forming a metal on the entire surfaces of the first capping layer 150, the amorphous silicon patterns for crystallization 211a, and the mask patterns 241 by performing a deposition process or a sputtering process. The metal layer for silicidation 250 may include, for example, one of nickel (Ni), copper (Cu), and palladium (Pd).

Figure 18A:
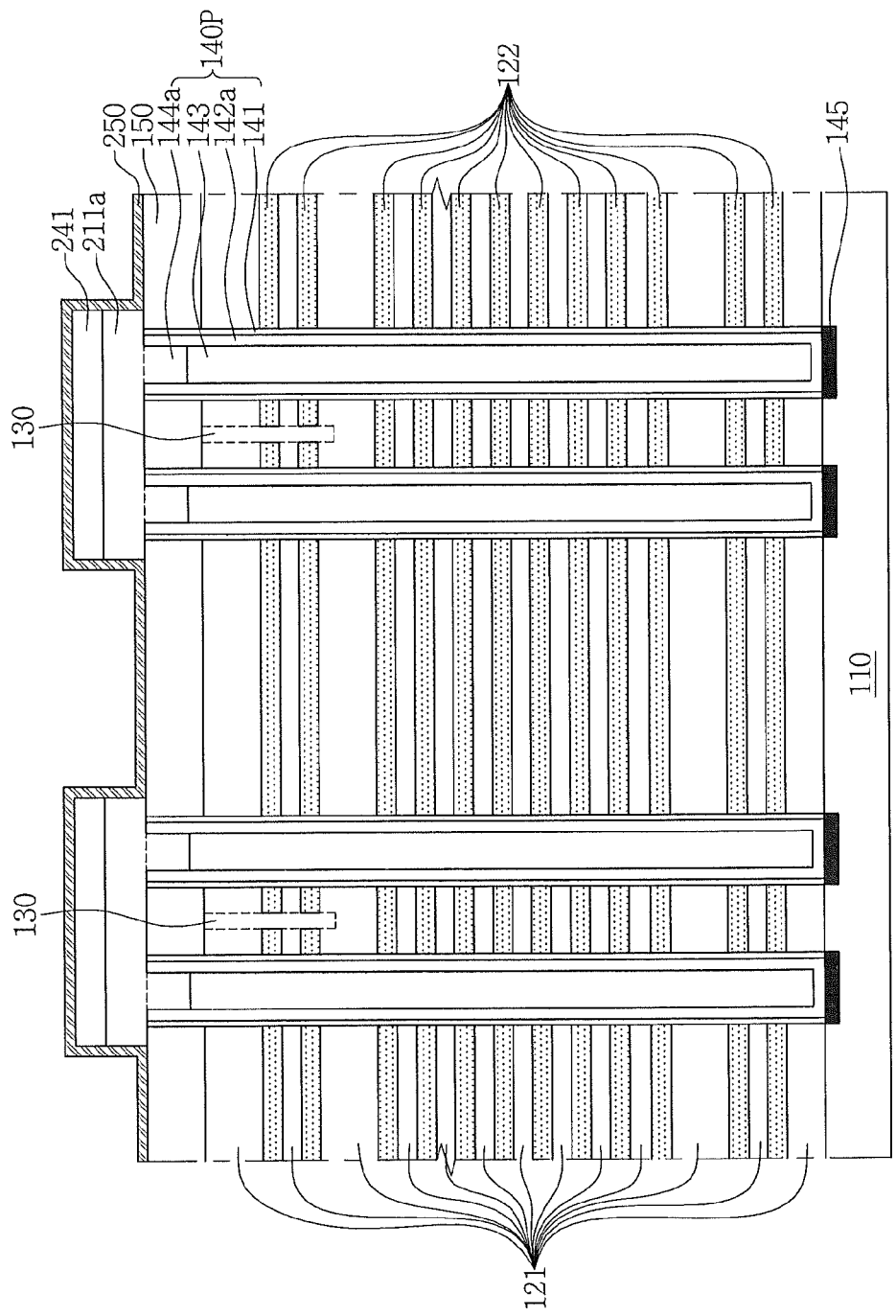
Figure 18B:
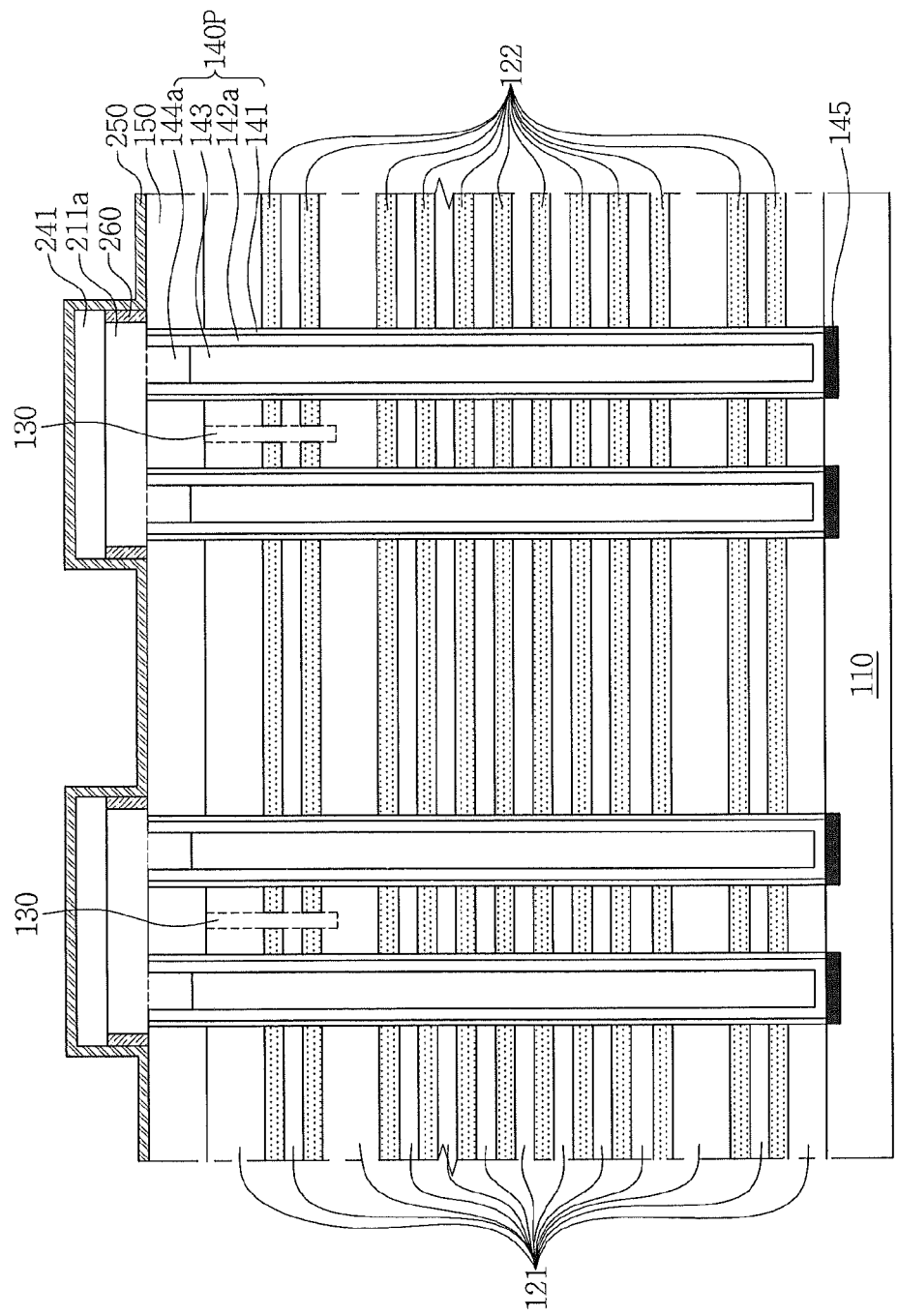

Referring to FIG. 18B, operations may include performing a silicidation process to form a metal silicide layer 260.

The metal silicide layer 260 may be formed in an area in which the metal layer for silicidation 250 is in direct contact with side surfaces of the amorphous silicon patterns for crystallization 211a, by performing a heat treatment for 3 to 5 minutes at about 350° C. to 450° C. The metal silicide layer 260 may include, for example, one of $NiSi_x$, $CuSi_x$, and $PdSi_x$.

Figure 18C:
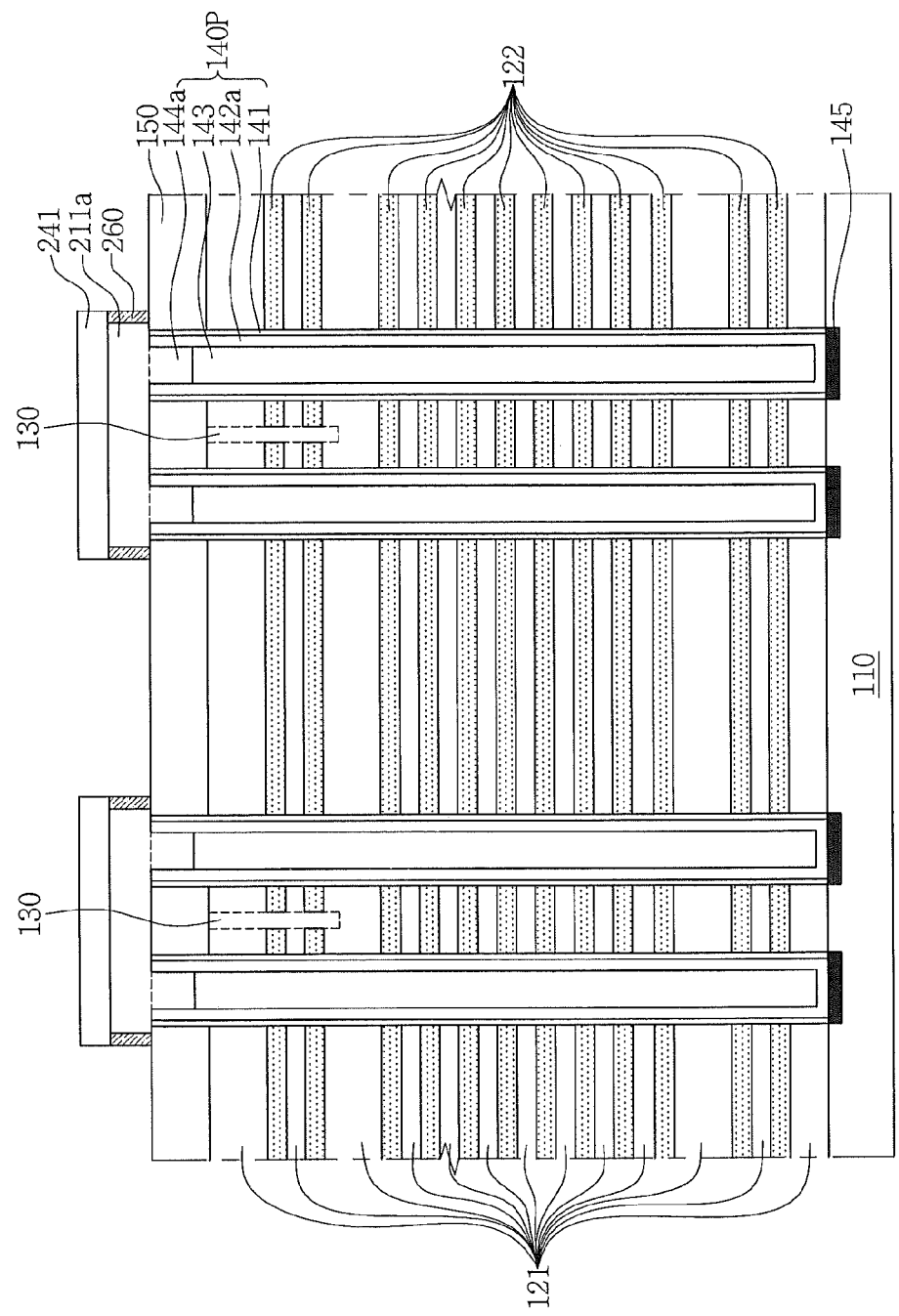

Referring to FIG. 18C, operations may include removing the metal layer for silicidation 250.

Figure 18D:
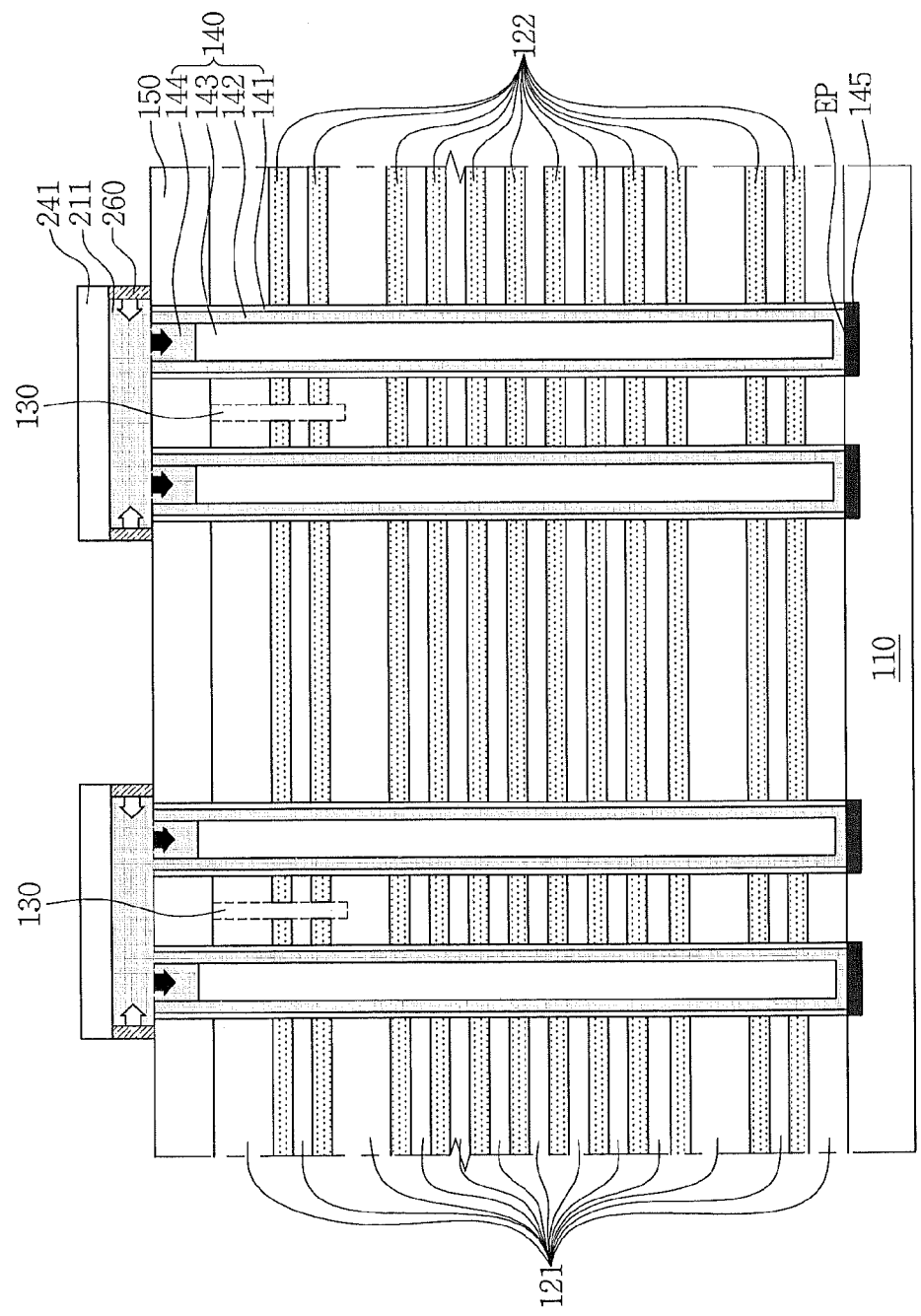

Referring to FIG. 18D, operations may include performing an annealing process to crystallize the amorphous silicon patterns for crystallization 211a, the amorphous channel active patterns 142a, and the amorphous channel pad pattern 144a into single-crystalline silicon (c-Si). The annealing process may be performed at a temperature of about 400° C. to 650° C.

The crystallization into single-crystalline silicon works as follows. A metal of the metal silicide layer 260 is diffused in the annealing process, the diffused metal is in direct contact with the side surfaces of the amorphous silicon patterns for crystallization 211a, the amorphous silicon patterns for crystallization 211a are crystallized into single-crystalline silicon by an MIC, and the amorphous channel active patterns 142a and the amorphous channel pad patterns 144a are crystallized into single-crystalline silicon by MILC.

More specifically, in this embodiment, the metal silicide layer 260 is formed on the side surfaces of the amorphous silicon patterns for crystallization 211a. Accordingly, during the annealing process, the amorphous silicon patterns for crystallization 211a may be single crystallized in the left and/or right direction (that is, in the direction of white arrows) from the side surfaces thereof by the MIC. In addition, the amorphous channel active patterns 142a and amorphous channel pad patterns 144a disposed under the mask patterns 241 may be single crystallized laterally (for example, in the direction of the black arrows) from boundaries of an area crystallized by the MIC, by the MILC.

During the process, the amorphous silicon patterns for crystallization 211a, the amorphous channel active patterns 142a, and the amorphous channel pad patterns 144a may be crystallized to be changed into single-crystalline silicon patterns 211, single-crystalline channel active patterns 142, and single-crystalline channel pad patterns 144, in the annealing process.

Next, the processes described with reference to FIG. 15E may be performed.

As described in FIGS. 14A to 18D, during the annealing process, amorphous silicon (a-Si) is crystallized and grown to be single-crystalline silicon (c-Si) by the MIC and the MILC. Here, a back end of the grown single-crystalline silicon (c-Si) may include a new phase having a higher concentration of a metal diffused from a metal catalyst used in the crystallization process than a front end and a middle end of the single-crystalline silicon (c-Si). For example, according to some embodiments of the inventive subject matter, a metal concentration in an ending part EP of the single-crystalline channel active patterns 142 may be relatively higher than that in top and middle parts of the single-crystalline channel active patterns 142. In addition, the metal concentration in the ending part EP of the single-crystalline channel active patterns 142 may be about $10^{19}/cm^2$ or less.

Figure 19:
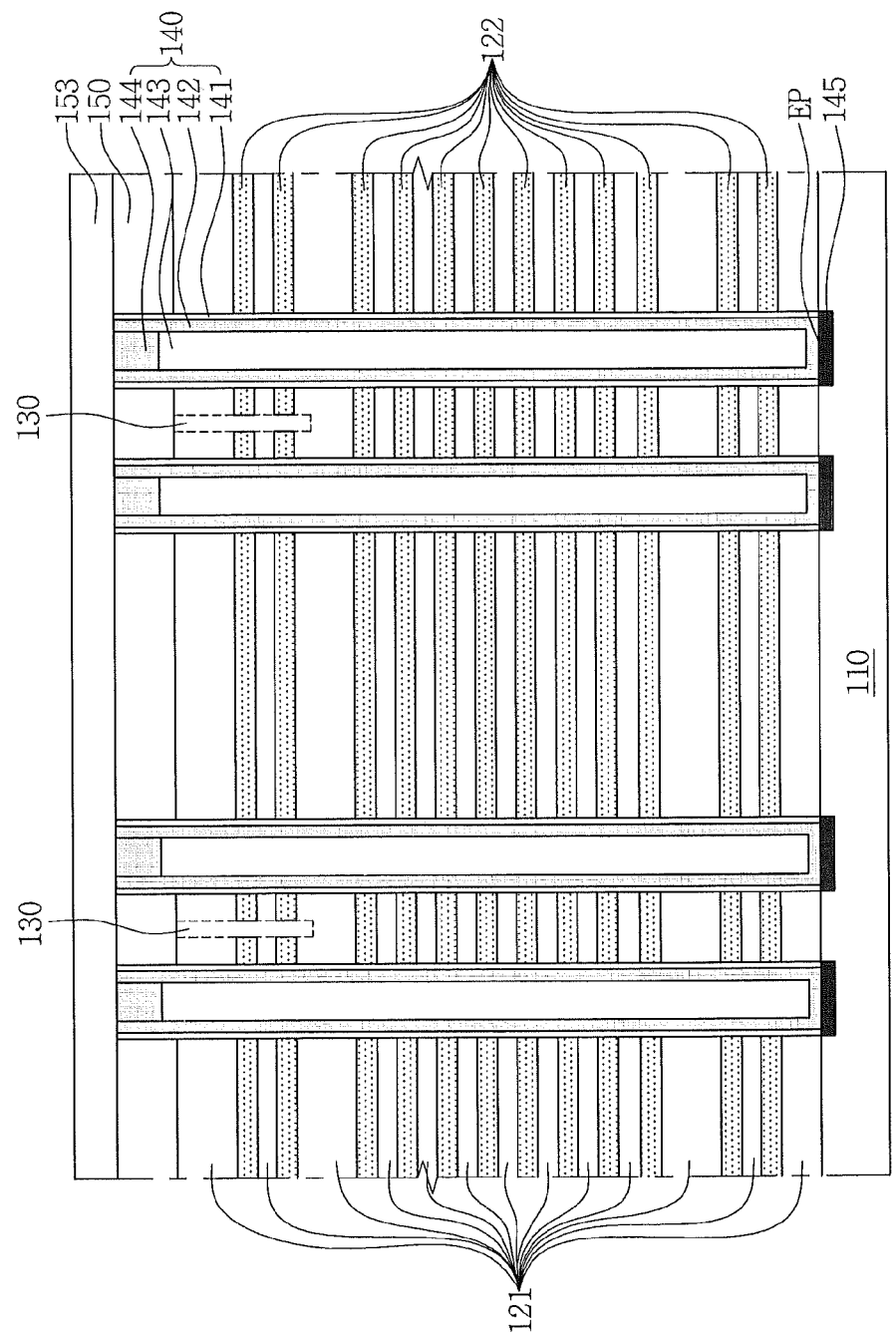

Referring to FIG. 19, operations may include forming a second capping layer 153 on the first capping layer 150 and the channel structures 140. The second capping layer 153 may include silicon oxide.

Figure 20:
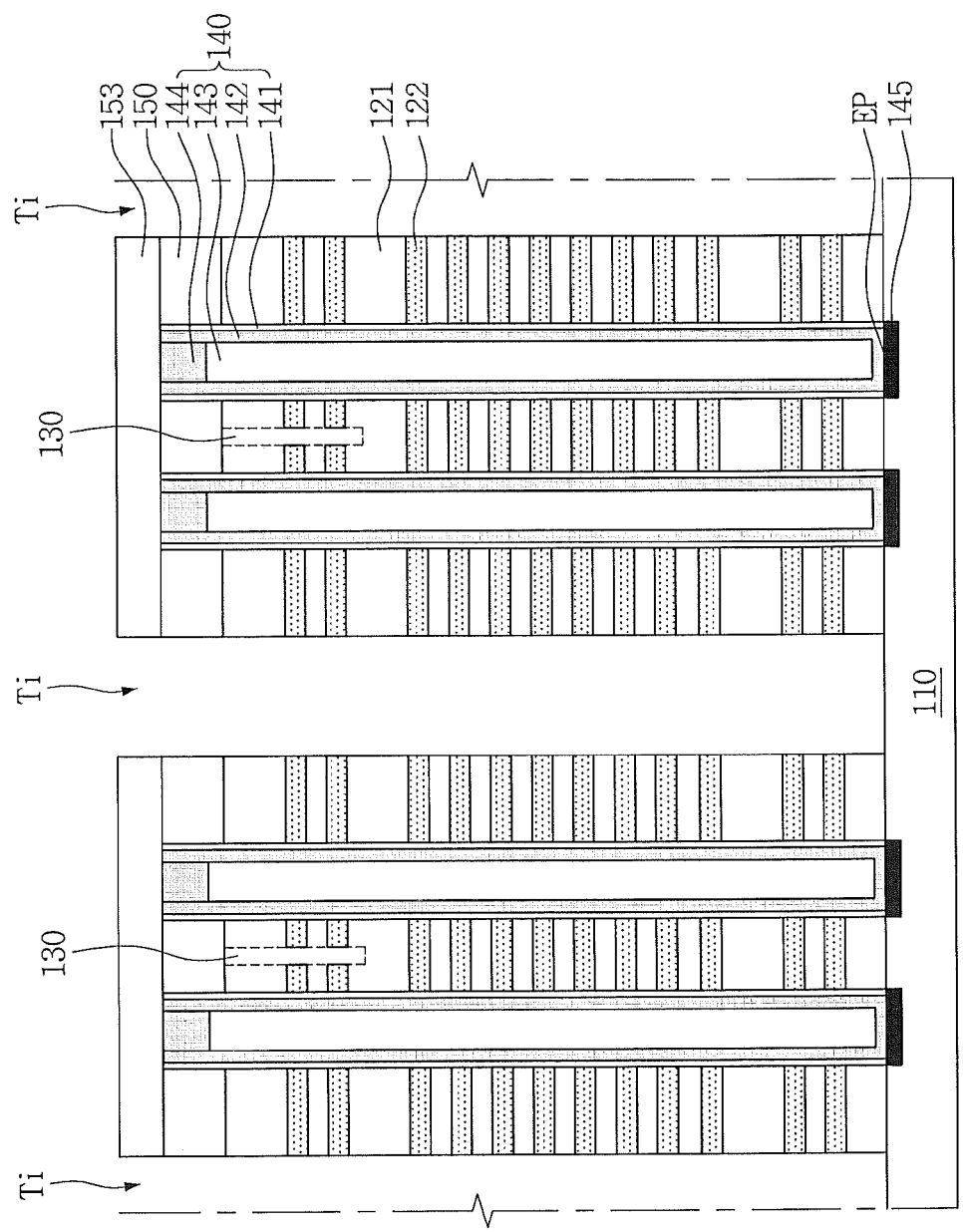

Referring to FIG. 20, operations may include forming trenches Ti vertically passing through the interlayer insulating layers 121, the sacrificial layers 122, and the first and second capping layers 150 and 153 to be in contact with the substrate 110, by performing an etch process. The trenches Ti may be arranged spaced apart from the channel structures 140 at a predetermined distance in a horizontal direction. In a plan view, the trenches Ti and the trenches T1 may have a parallel line shape.

Figure 21:
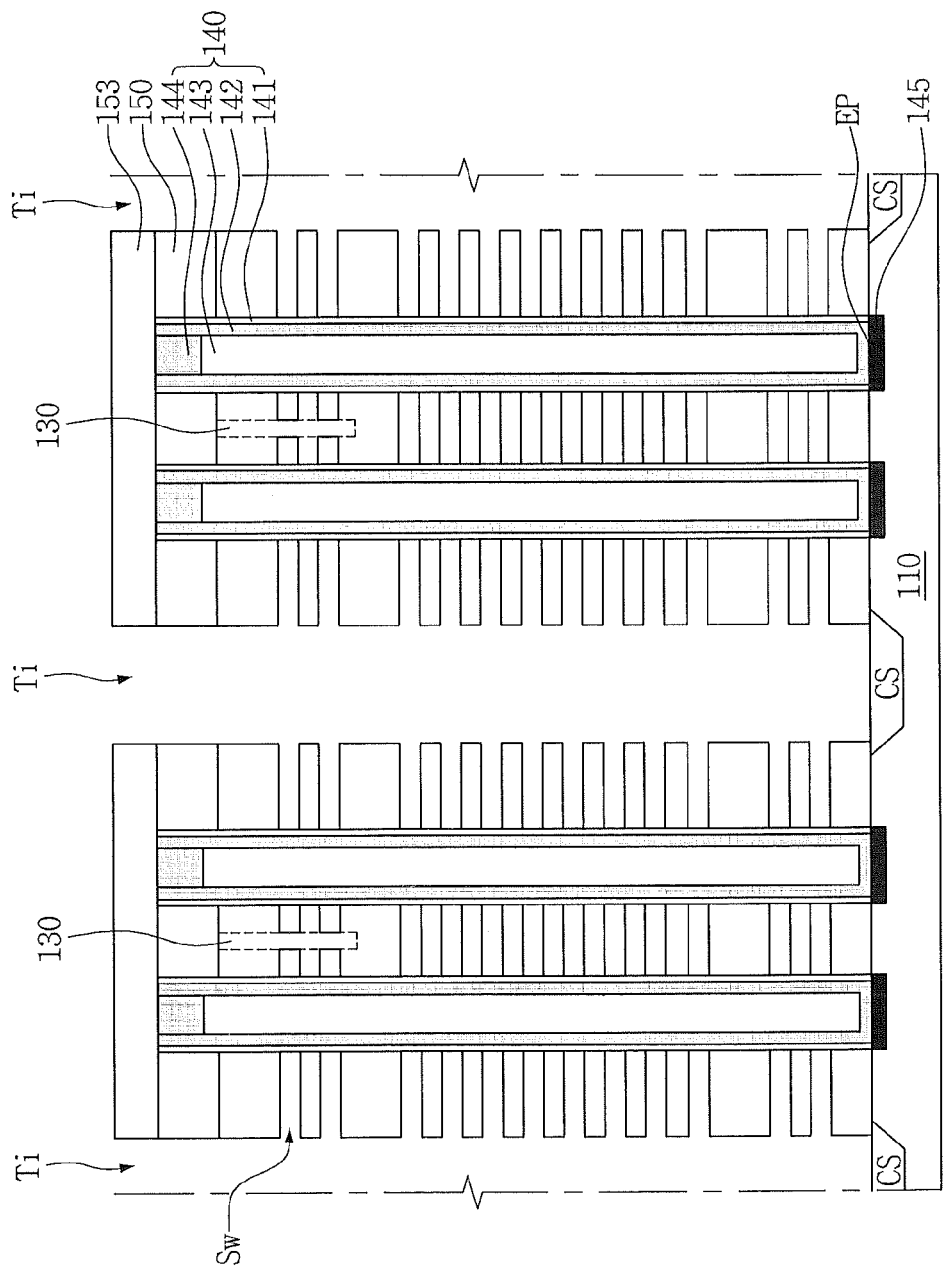

Referring to FIG. 21, operations may include removing the sacrificial layers 122 through the trenches Ti to form word line spaces Sw.

Figure 22:
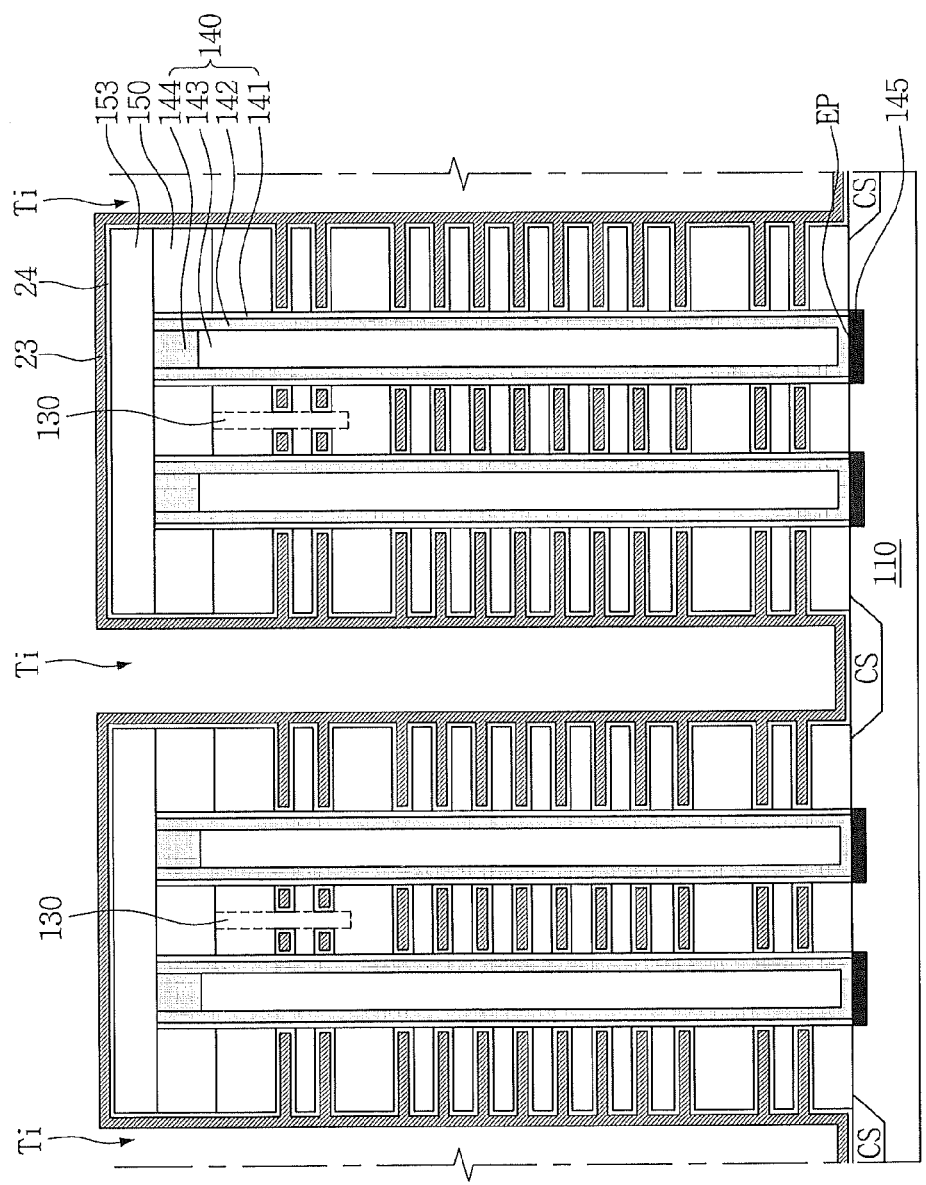

Referring to FIG. 22, operations may include forming a blocking layer 24 and word line electrode materials 23 in the word line spaces Sw. Forming the blocking layer 24 may include forming an insulating material having a high work function such as aluminum oxide by performing a deposition process such as an ALD process. The word line electrode materials 23 may include forming a metal such as tungsten (W) by performing a deposition process.

Figure 23:
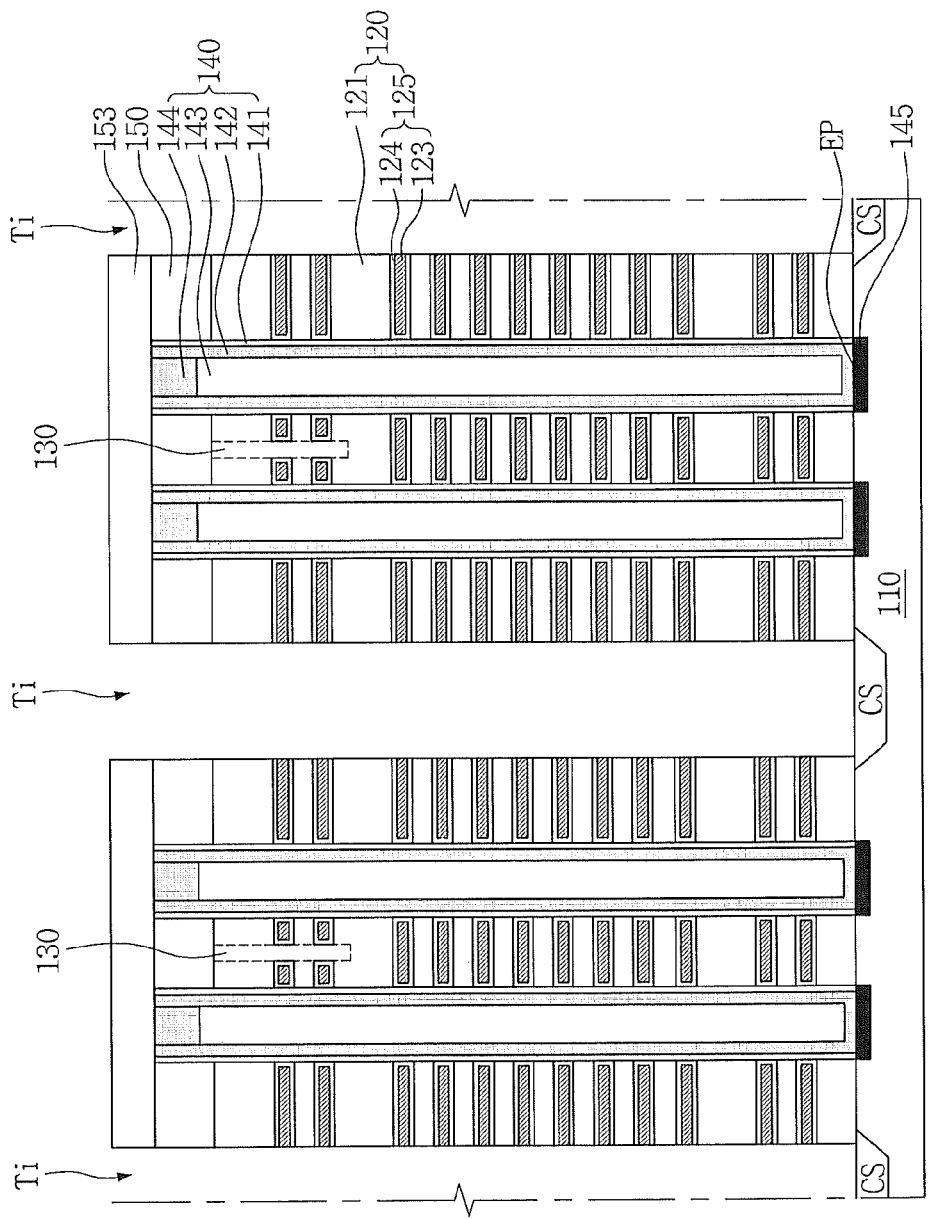

Referring to FIG. 23, operations may include removing the word line electrode materials 23 and the blocking layer 24 which are exposed on an upper surface of the second capping layer 153 and exposed in the trenches Ti to form blocking patterns 124 and word line electrodes 123 by performing an etchback process.

Figure 24:
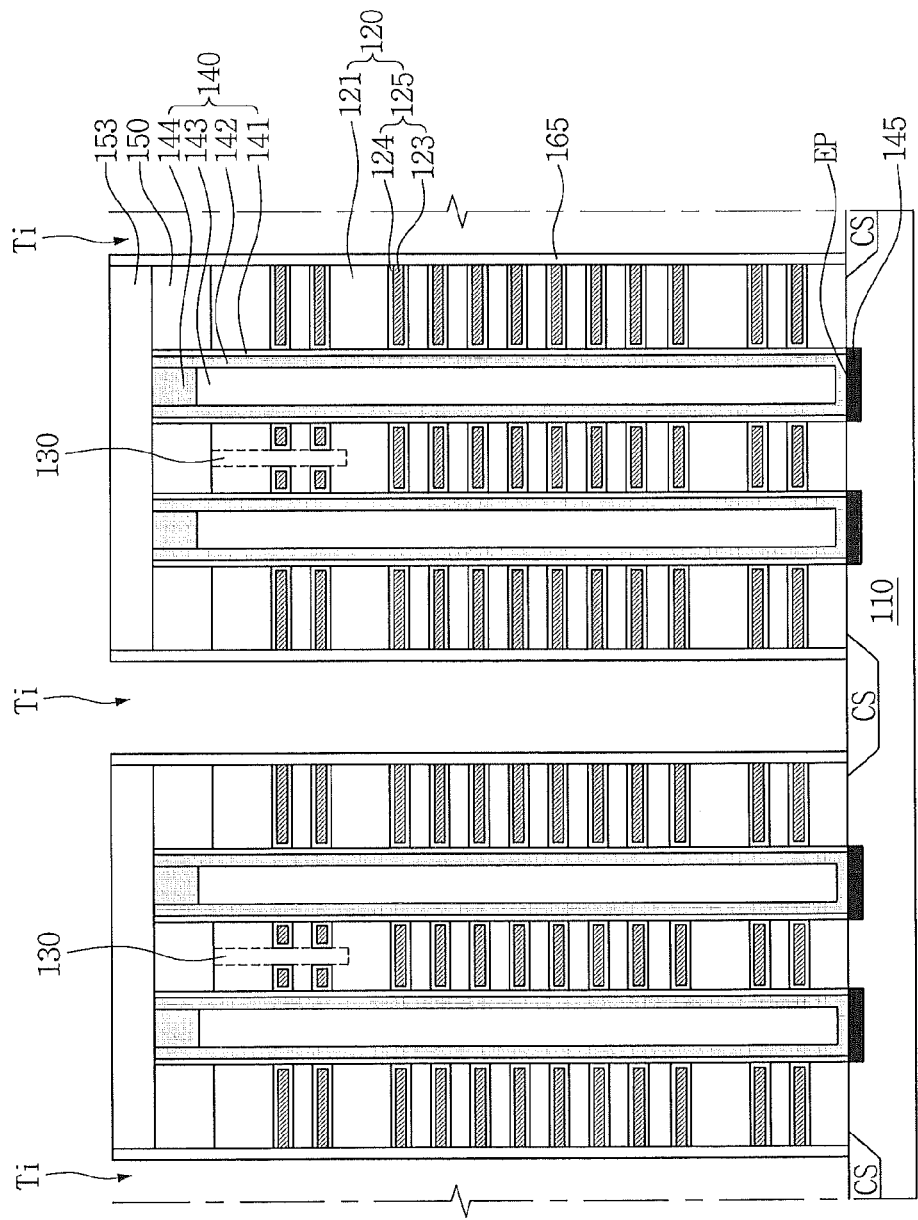

Referring to FIG. 24, operations may include forming spacers 165 on inner walls of the trenches Ti, and forming common source electrodes CS. The spacers 165 may include silicon oxide or silicon nitride. The formation of the common source electrodes CS may include injecting elements, such as phosphorus (P), arsenic (As), and boron (B), into the substrate 110.

Figure 25:
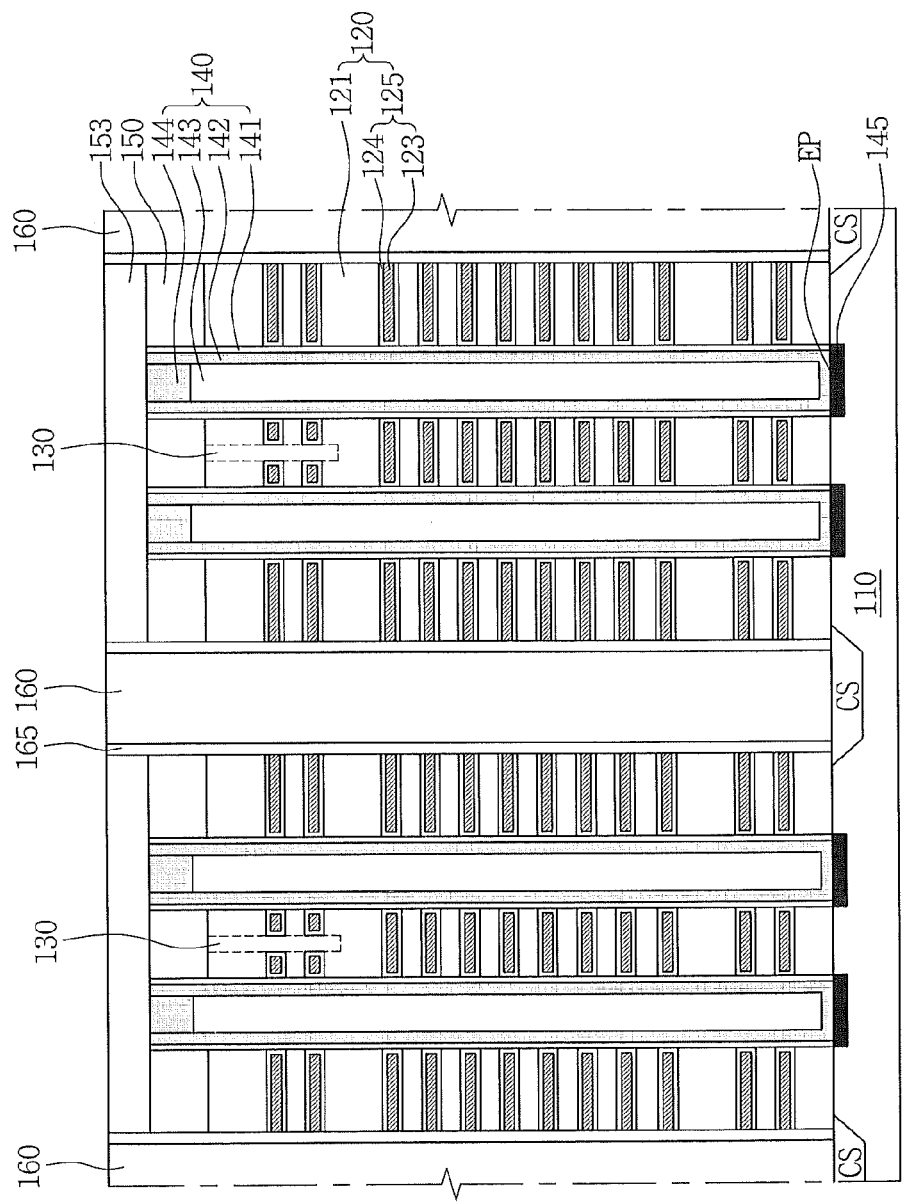

Referring to FIG. 25, operations may include forming device isolation patterns 160 filling the trenches Ti. The device isolation pattern 160 may include silicon oxide.

Figure 26:
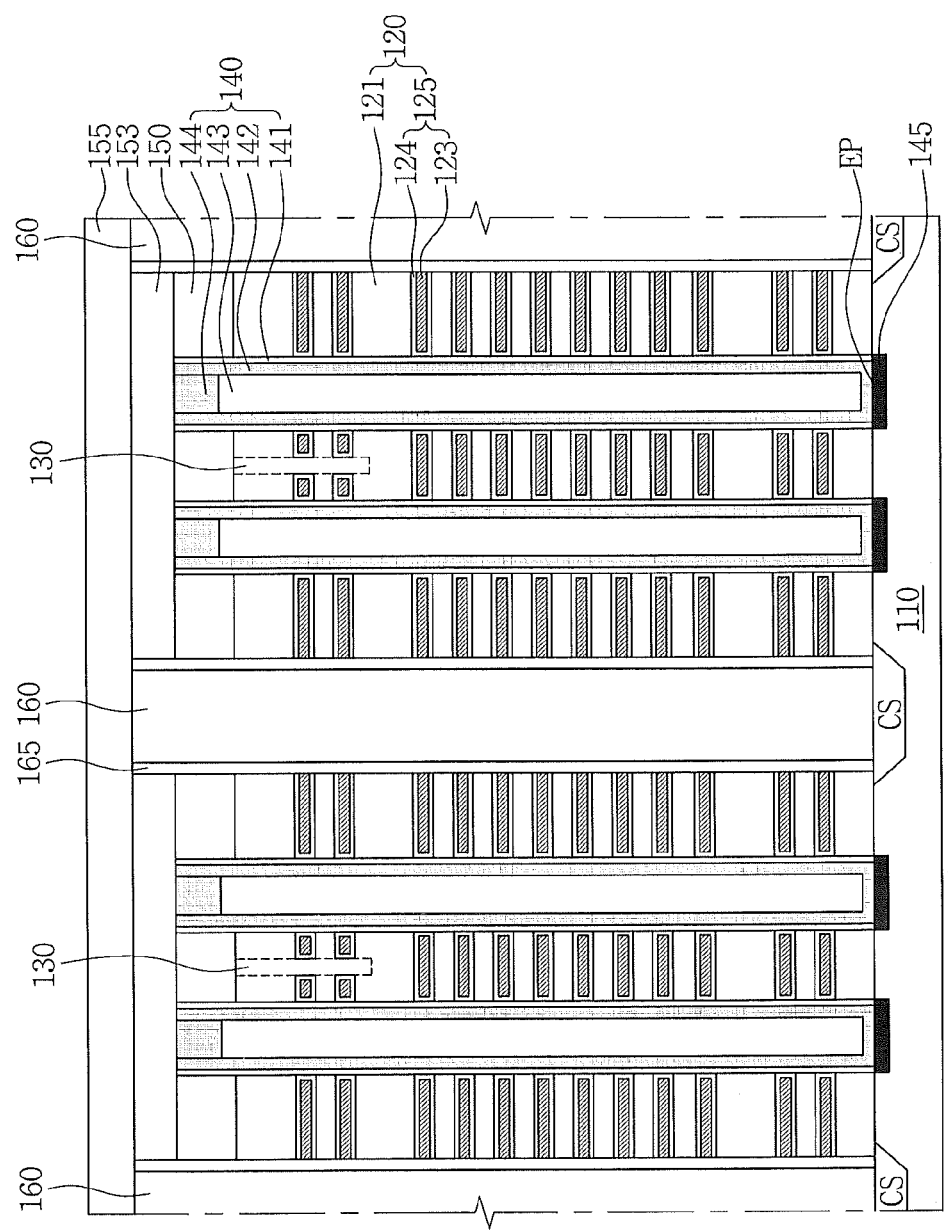

Referring to FIG. 26, operations may include forming a third capping layer 153 covering the trenches Ti and the second capping layer 153. The third capping layer 153 may include silicon oxide.

Figure 27:
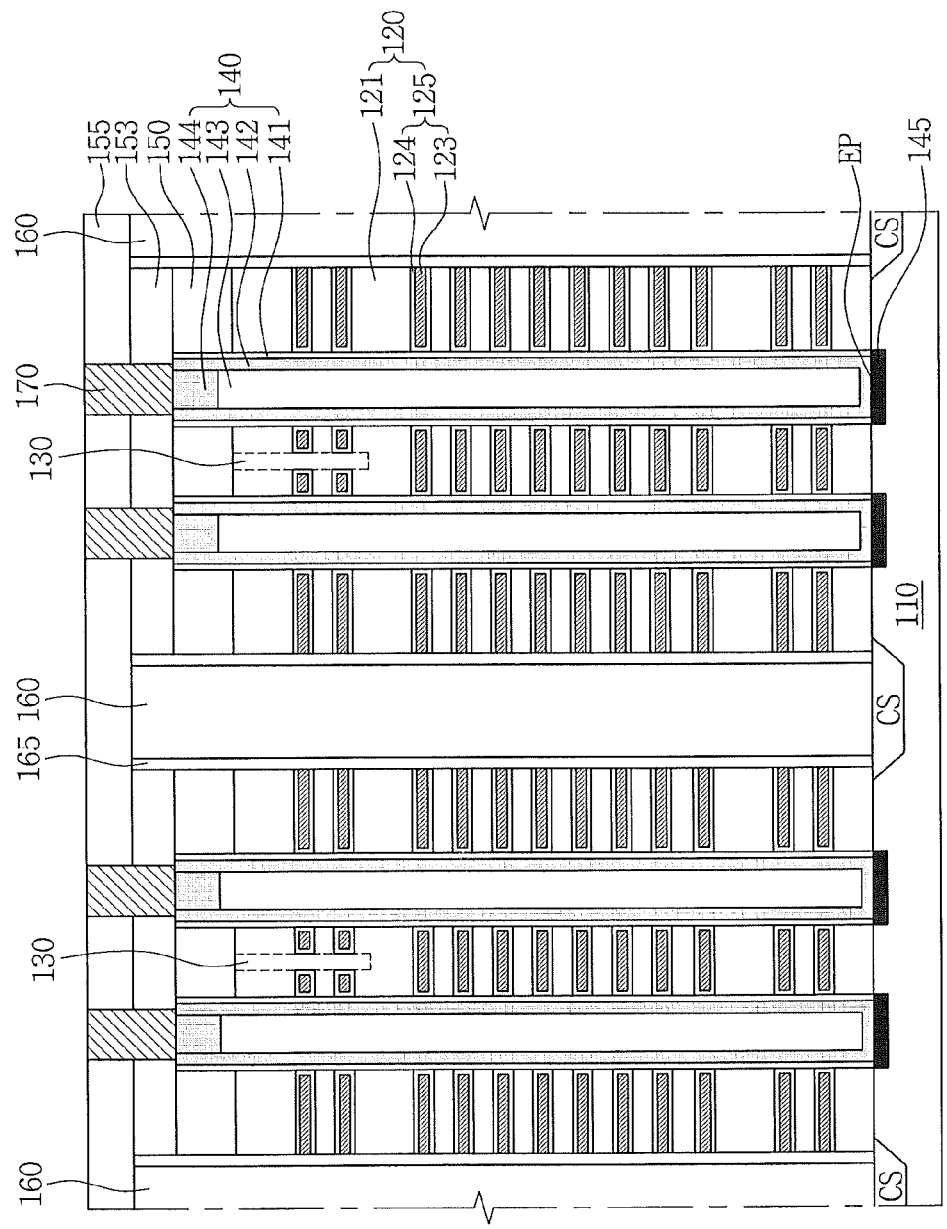

Referring to FIG. 27, operations may include forming bit line plugs 170 electrically connected to the single-crystalline channel pad patterns 144. Forming the bit line plugs 170 may include forming via holes which vertically pass through the second and third capping layers 153 and 155 and expose surfaces of the single-crystalline channel pad patterns 144 arranged on upper portions of the channel structures 140, and filling the via holes with the conductive material. The bit line plugs 170 may include a metal, a metal compound, and/or a metal silicide. Side surfaces of the bit line plugs 170 may be surrounded by the second and third capping layers 153 and 155.

Next, referring again to FIG. 2, the method may further include forming bit lines 180 electrically connected to the bit line plugs 170 on the third capping layer 153. The bit lines 180 may include a metal or a metal compound. In a plan view, the bit lines 180 may have a parallel line shape.

According to some embodiments of the inventive subject matter, since amorphous silicon (a-Si) channel patterns are crystallized into single-crystalline silicon (c-Si) channel patterns in an annealing process, grain sizes in the channel patterns may increase, and thereby current mobility may be improved. In addition, according to some embodiments of the inventive subject matter, when the amorphous silicon (a-Si) channel patterns are crystallized into the single-crystalline silicon (c-Si) channel patterns in the annealing process, the amount of metal diffused from the metal catalyst can be suppressed and controlled depending on an insulating barrier layer by interposing the insulating barrier layer between a metal catalyst and amorphous silicon, resulting in minimizing metal contamination in the channel patterns which are crystallized into the single-crystalline silicon. Accordingly, current characteristics can be significantly improved by reducing leakage current in the channel patterns which are crystallized into the single-crystalline silicon.

Figure 28A:
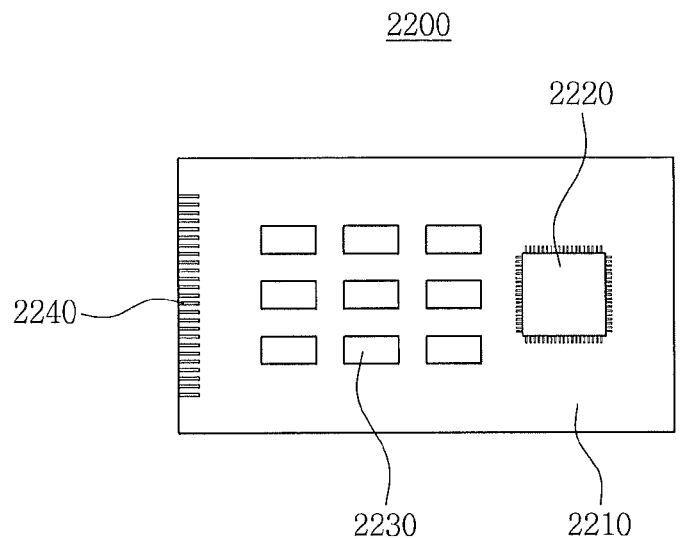
FIG. 28A is a diagram schematically showing a semiconductor module including a semiconductor device in accordance with some embodiments of the inventive subject matter.

FIG. 28A is a diagram schematically showing a semiconductor module 2200 including a semiconductor device 100 in accordance with some embodiments of the inventive subject matter. Referring to FIG. 28A, the semiconductor module 2200 in accordance with some embodiments of the inventive subject matter may include a processor 2220 installed in a semiconductor module substrate 2210, and memory devices 2230. The processor 2220 or the memory devices 2230 may include the semiconductor device 100 in accordance with some embodiments of the inventive subject matter. Input/output terminals 2240 may be arranged on at least one side of the module substrate 2210.

Figure 28B:
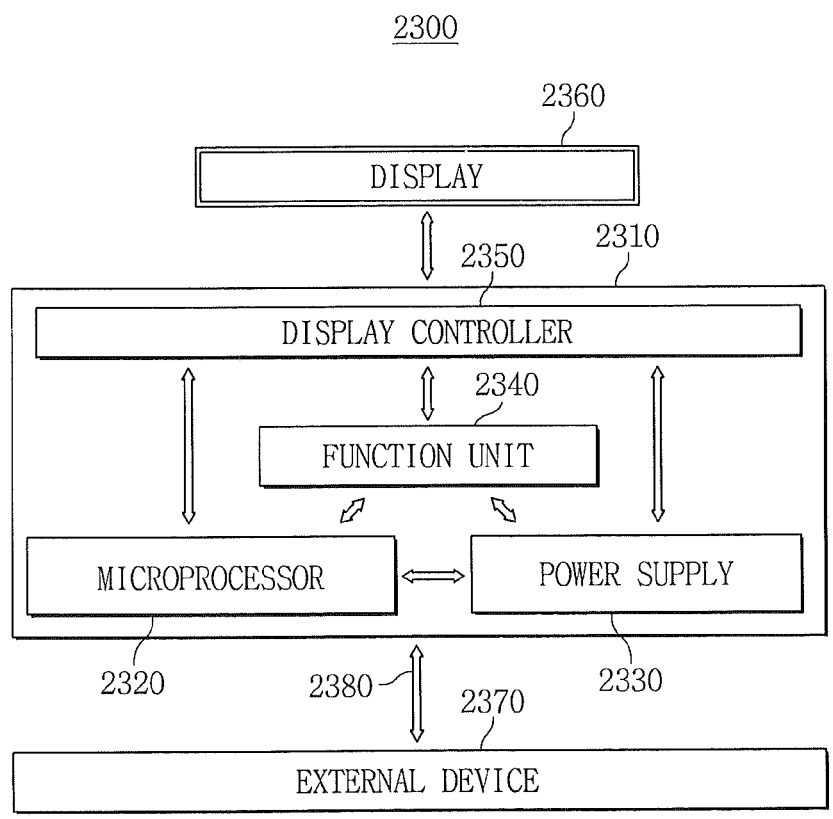
FIGS. 28B and 28C are block diagrams schematically showing electronic systems including a semiconductor device in accordance with embodiments of the inventive subject matter.
Figure 28C:
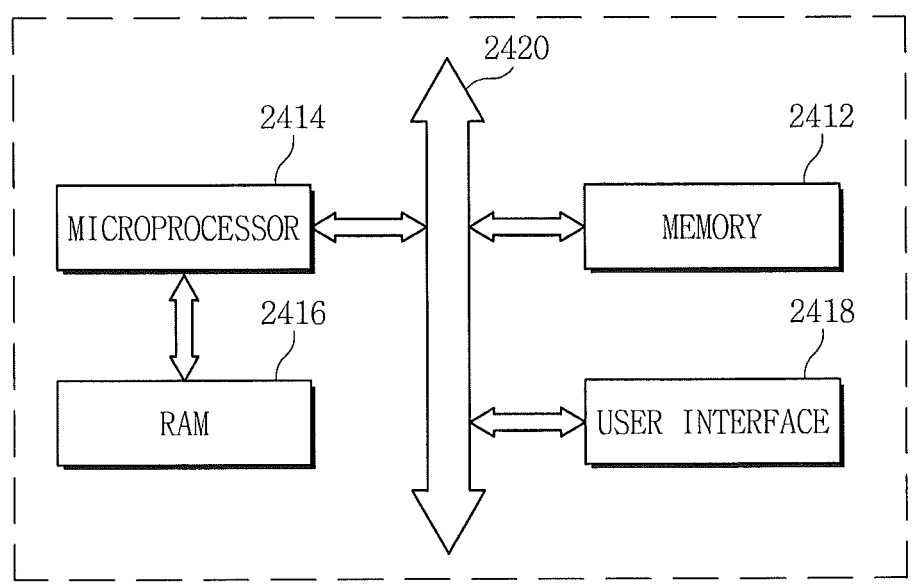

FIGS. 28B and 28C are system block diagrams schematically showing electronic systems in accordance with embodiments of the inventive subject matter. Referring to FIG. 28B, the electronic system 2300 in accordance with some embodiments of the inventive subject matter may include a body 2310, a display unit 2360, and an external apparatus 2370. The body 2310 may include a microprocessor unit 2320, a power supply 2330, a function unit 2340, and/or a display control unit 2350. The body 2310 may include a system board or motherboard having a printed circuit board (PCB), and/or a case. The microprocessor unit 2320, the power supply 2330, the function unit 2340, and the display controller unit 2350 may be installed or arranged on an upper surface or an inside of the body 2310. A display unit 2360 may be arranged on the upper surface or inside/outside of the body 2310. The display unit 2360 may display an image processed by the display controller unit 2350. For example, the display unit 2360 may include a liquid crystal display (LCD), an active matrix organic light emitting diode (AMOLED), or a variety of display panels. The display unit 2360 may include a touch screen. Accordingly, the display unit 2360 may have an input/output function. The power supply 2330 may supply a current or a voltage to the microprocessor unit 2320, the function unit 2340, and the display controller unit 2350, etc. The power supply 2330 may include a rechargeable battery, a socket for the battery, or a voltage/current converter. The microprocessor unit 2320 may receive a voltage from the power supply 2330 to control the function unit 2340 and the display unit 2360. For example, the microprocessor unit 2320 may include a CPU or an application processor (AP). The function unit 2340 may perform various functions. For example, the function unit 2340 may include a touch pad, a touch screen, a volatile/nonvolatile memory, a memory card controller, a camera, a light, an audio and video playback processor, a wireless transmission/reception antenna, a speaker, a microphone, a USB port, and other units having various functions.

Referring to FIG. 28C, an electronic system 2400 in accordance with some embodiments of the inventive subject matter may include a microprocessor 2414, a memory system 2412, and a user interface 2418 which perform data communication using a bus 2420. The microprocessor 2414 may include a CPU or an AP. The electronic system 2400 may further include a random access memory (RAM) 2416 which directly communicates with the microprocessor 2414. The microprocessor 2414 and/or the RAM 2416 can be assembled in a single package. The user interface 2418 may be used to input or output data to or from the electronic system 2400. For example, the user interface 2418 may include a touch pad, a touch screen, a keyboard, a mouse, a scanner, a voice detector, a cathode ray tube (CRT) monitor, an LCD, an AMOLED, a plasma display panel (PDP), a printer, a light, or various other input/output devices. The memory system 2412 may store codes for operating the microprocessor 2414, data processed by the microprocessor 2414, or external input data. The memory system 2412 may include a memory controller, a hard disk, or a solid state drive (SSD). The microprocessor 2414, the RAM 2416, and/or the memory system 2412 may include a semiconductor device 100 in accordance with some embodiments of the inventive subject matter.

Since a semiconductor device in accordance with some embodiments of the inventive subject matter has single-crystalline channel patterns, the semiconductor device has good carrier mobility, a high speed, a low leakage current, excellent data storage ability, and a long life.

Metal contamination in crystallized channel areas can be minimized using operations for fabricating semiconductor devices in accordance with some embodiments of the inventive subject matter.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive subject matter as defined in the claims. In the claims, means-plus-function clauses are intended to cover the structures described herein as performing the recited function, and not only structural equivalents but also equivalent structures.

What is claimed is:

1. A method of fabricating a semiconductor device, the method comprising:
   forming alternating interlayer insulating layers and sacrificial layers on a substrate;
   forming a first capping layer on the interlayer insulating layers and the sacrificial layers;
   forming a channel hole passing through the first capping layer, the interlayer insulating layers and the sacrificial layers to expose a first portion of the substrate;
   forming a dielectric pattern conforming to a wall of the channel hole;
   forming an amorphous channel active pattern conforming to the dielectric pattern and the exposed first portion of the substrate;
   forming a channel core pattern in a space defined by the amorphous channel active pattern;
   forming an amorphous silicon layer on the first capping layer and the amorphous channel active pattern;
   forming a mask pattern on the amorphous silicon layer and the amorphous channel active pattern;
   forming an insulating barrier layer on the mask pattern;
   forming a metal catalytic layer on the insulating barrier layer; and
   annealing to change the amorphous silicon layer and the amorphous channel active pattern into a single-crystalline silicon layer and a single-crystalline channel active pattern, respectively.

2. The method of claim 1, wherein the mask pattern exposes a portion of the amorphous silicon layer.

3. The method of claim 1:
   wherein forming the insulating barrier layer on the mask pattern is preceded by etching the amorphous silicon layer to form an amorphous silicon pattern having a side wall aligned with a side wall of mask pattern and to expose a portion of the first capping layer; and
   wherein forming the insulating barrier layer on the mask pattern comprises forming the insulating barrier layer on the side wall of the amorphous silicon pattern and the exposed portion of the first capping layer.

4. The method of claim 1:
   wherein forming an amorphous silicon layer on the first capping layer and the amorphous channel active pattern is preceded by forming an amorphous channel pad pattern on the amorphous channel active pattern;
   wherein forming an amorphous silicon layer on the first capping layer and the amorphous channel active pattern comprises forming the amorphous silicon layer on the amorphous channel pad pattern; and
   wherein annealing to change the amorphous silicon layer and the amorphous channel active pattern into a single-crystalline silicon layer and a single-crystalline channel active pattern, respectively, comprises annealing to change the amorphous silicon layer, the amorphous channel active pattern and the amorphous channel pad pattern into a single-crystalline silicon layer, a single-crystalline channel active pattern, and a single-crystalline channel pad pattern, respectively.

5. The method of claim 4, wherein forming the amorphous channel pad pattern comprises:
   recessing an upper portion of the channel core pattern in the channel hole to form a channel pad space bounded by the amorphous channel active pattern and a top surface of the recessed channel core pattern; and
   forming the amorphous channel pad pattern in the channel pad space.

6. The method of claim 1, further comprising forming a metal silicide layer by siliciding a part of the amorphous silicon layer in contact with the metal catalytic layer.

7. The method of claim 1, further comprising:
   removing the metal catalytic layer;
   removing the single-crystalline silicon layer;
   forming a second capping layer on the single-crystalline channel pad pattern;
   forming a trench passing through the second capping layer, the interlayer insulating layers, and the sacrificial layers, and exposing a second portion of the substrate;
   forming word line spaces by removing the sacrificial layers through the trench;
   forming word lines in the word line spaces; and
   forming a device isolation pattern in the trench.

8. The method of claim 1, further comprising:
   forming a trench vertically isolating parts of upper surfaces of the interlayer insulating layers, and parts of upper surfaces of the sacrificial layers; and
   forming a line isolation pattern in the trench.

9. The method of claim 1, wherein a metal concentration in a portion of the single-crystalline channel active pattern proximate the substrate is greater than metal concentrations in portions of the single-crystalline channel active pattern further displaced from the substrate.

10. The method of claim 9, wherein the metal concentration in the portion of the single-crystalline channel active pattern proximate the substrate is less than or equal to about $10^{19}/cm^2$.

11. The method of claim 1, further comprising forming a crystal growth layer on the exposed substrate in the channel hole using an epitaxial growth process prior to forming the amorphous channel active pattern and the single-crystalline channel active pattern.

12. The method of claim 11, wherein the amorphous channel active pattern and the single-crystalline channel active pattern are formed in direct contact with the crystal growth layer.

13. A method of fabricating a semiconductor device, the method comprising:
   forming a stacked structure of alternating interlayer insulating layers and sacrificial layers on a substrate;
   forming a channel hole vertically passing through the stacked structure and exposing a portion of the substrate;
   forming a channel structure including amorphous silicon in the channel hole;
   forming an amorphous silicon region on the channel structure;
   forming a metal catalytic layer on the amorphous silicon region;
   annealing to change the amorphous silicon and the channel structure to single-crystalline silicon using a metal induced crystallization that proceeds from the amorphous silicon region to the channel structure;
   removing the metal catalytic layer;
   removing the crystallized silicon region prior to forming the bit line plug and the bit line; and
   forming a bit line plug and a bit line on the channel structure after removing the crystallized silicon region.

14. The method of claim 13, further comprising:
   removing portions of the sacrificial layers to form word line spaces between the insulating layers; and
   forming word lines in the word line spaces.

15. A method of fabricating a semiconductor device, the method comprising:
   forming a hole passing through a stacked structure of alternating insulating and sacrificial layers on a substrate;

forming an amorphous silicon layer conforming to an inner wall of the hole;

forming a silicon region on the amorphous silicon layer;

metal induced crystallizing the amorphous silicon layer via the silicon region to form a single-crystalline channel structure in the hole;

removing the silicon region;

removing portions of the sacrificial layers to form word line spaces; forming word lines in the word line spaces; and forming a bit line electrically coupled to the channel structure.

16. The method of claim 15, wherein metal induced crystallizing the amorphous silicon layer via the silicon region to form a single-crystalline channel structure in the hole comprises:

forming a metal catalytic layer on the silicon region; and annealing to metal induced crystallize the amorphous silicon pattern via the silicon region.

* * * * *